US011195841B2

(12) United States Patent
Jen et al.

(10) Patent No.: US 11,195,841 B2
(45) Date of Patent: Dec. 7, 2021

(54) INTEGRATED CIRCUIT AND METHOD FOR MANUFACTURING THE SAME

(71) Applicant: TAIWAN SEMICONDUCTOR MANUFACTURING CO., LTD., Hsinchu (TW)

(72) Inventors: Chi-Chung Jen, Kaohsiung (TW); Yu-Chu Lin, Tainan (TW); Cheng-Hsiang Wang, Kaohsiung (TW); Yi-Ling Liu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/745,214

(22) Filed: Jan. 16, 2020

(65) Prior Publication Data
US 2021/0225855 A1    Jul. 22, 2021

(51) Int. Cl.
*H01L 27/11519* (2017.01)
*H01L 29/423* (2006.01)
*H01L 21/28* (2006.01)

(52) U.S. Cl.
CPC .. *H01L 27/11519* (2013.01); *H01L 29/40114* (2019.08); *H01L 29/42328* (2013.01)

(58) Field of Classification Search
CPC ......... H01L 27/11519; H01L 29/42328; H01L 29/40114
See application file for complete search history.

(56) References Cited

U.S. PATENT DOCUMENTS

2014/0312405 A1* 10/2014 Park ................... H01L 29/40114
                                                              257/316
2017/0117372 A1*  4/2017 Li ...................... H01L 29/42336
2018/0138317 A1*  5/2018 Lin ..................... H01L 29/6656

* cited by examiner

*Primary Examiner* — Mohammed R Alam
(74) *Attorney, Agent, or Firm* — Maschoff Brennan

(57) ABSTRACT

A method for manufacturing an integrated circuit is provided. The method includes depositing a floating gate electrode film over a semiconductor substrate; patterning the floating gate electrode film into at least one floating gate electrode having at least one opening therein; depositing a control gate electrode film over the semiconductor substrate to overfill the at least one opening of the floating gate electrode; and patterning the control gate electrode film into at least one control gate electrode over the floating gate electrode.

20 Claims, 28 Drawing Sheets

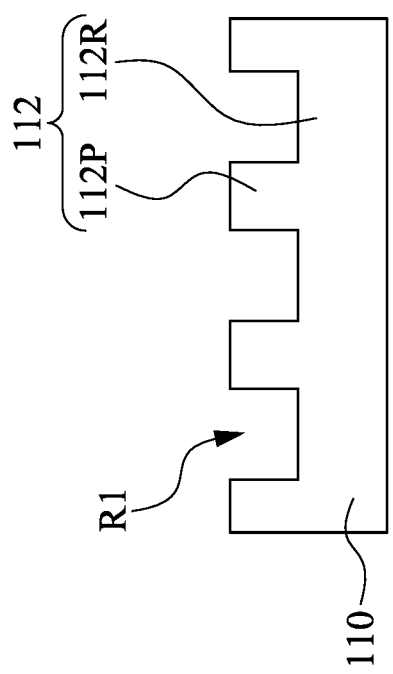
Fig. 2D
Fig. 2C

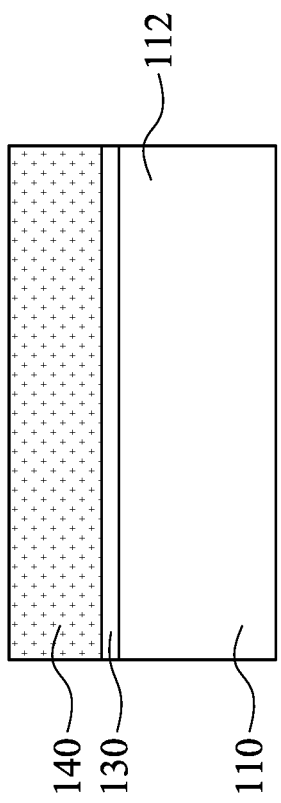
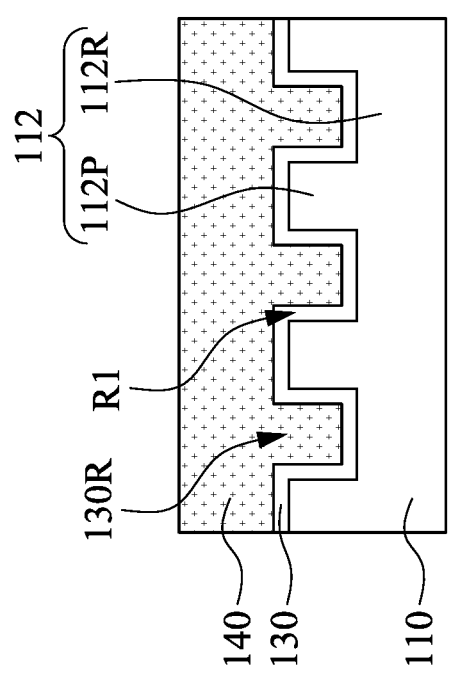
Fig. 3C
Fig. 3B

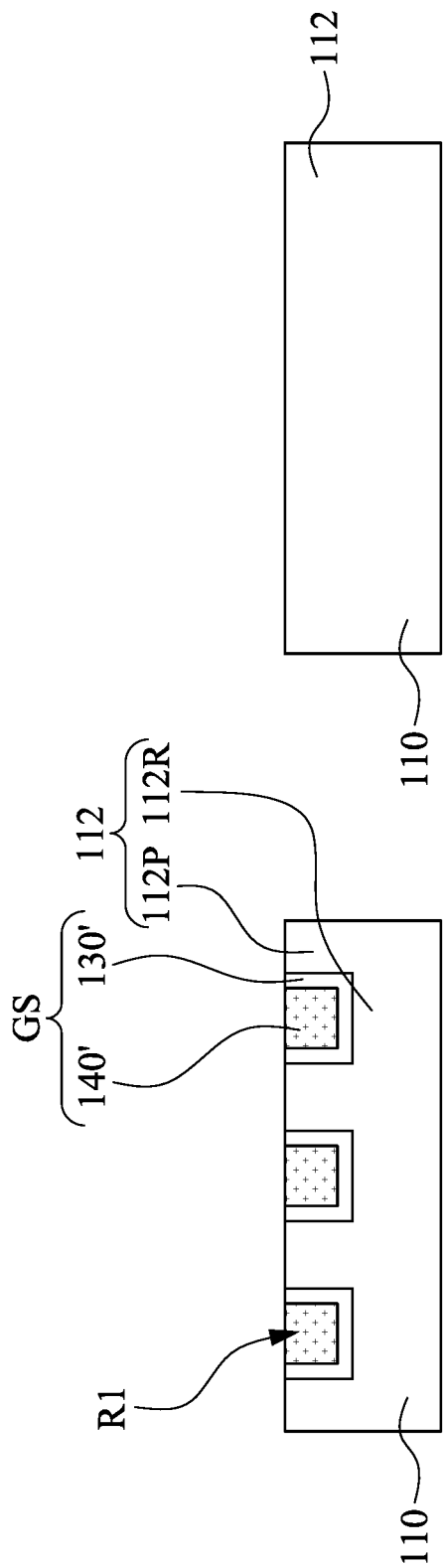

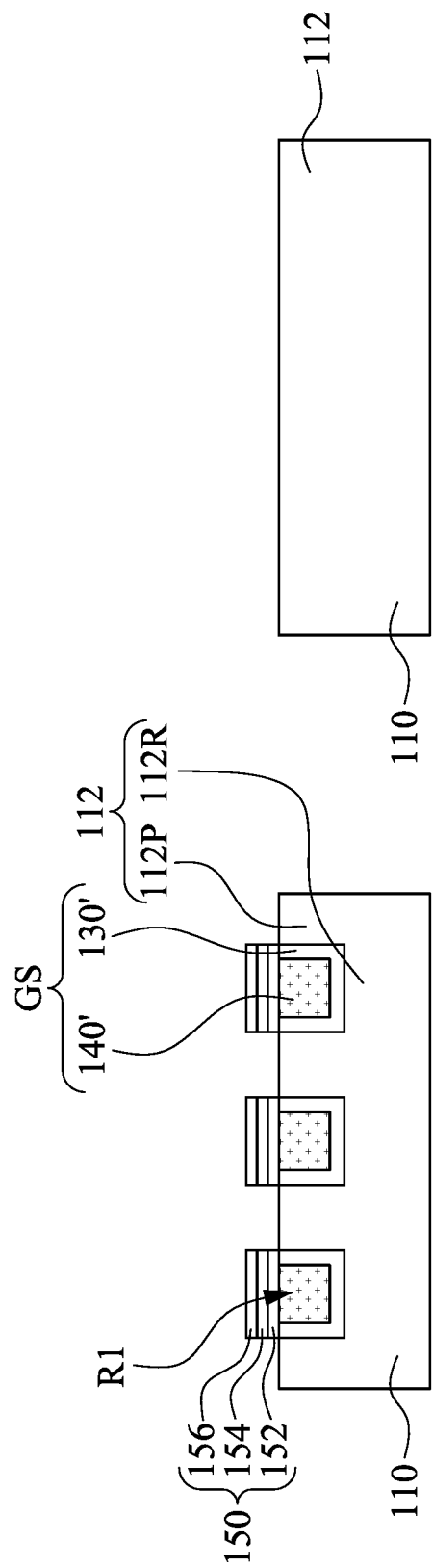

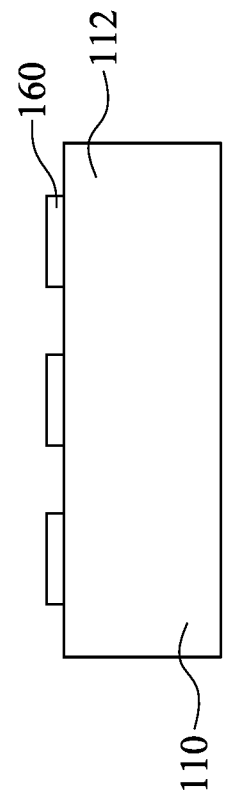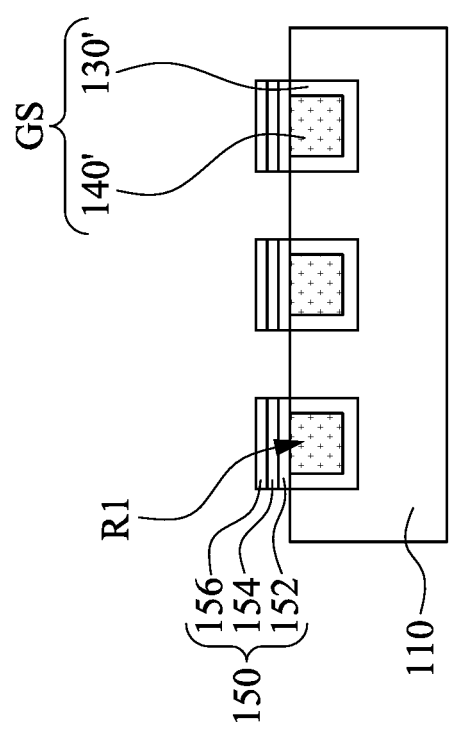
Fig. 6B
Fig. 6C

INTEGRATED CIRCUIT AND METHOD FOR MANUFACTURING THE SAME

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

Flash technology has enabled designers to create cost effective and high performance programmable SOC (system on chip) solutions through the use of split-gate flash memory cells. The aggressive scaling of memory cells enables designing flash memories with very high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 13B illustrate a method for fabricating an integrated circuit at different stages in accordance with some embodiments of the present disclosure.

DETAILED DESCRIPTION

Figure 1A:
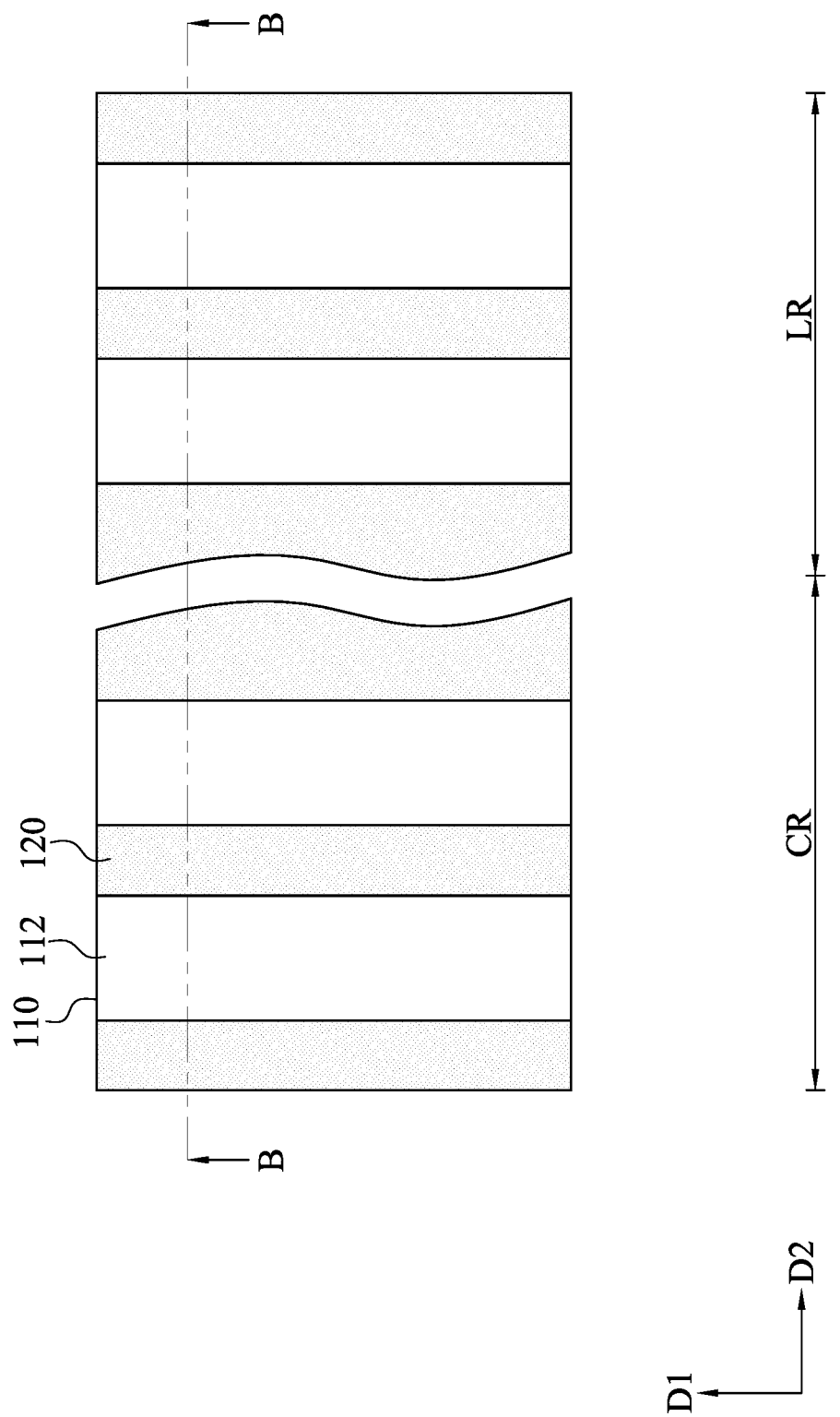

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A flash memory cell may include a transistor that has two gate structures. The first gate structure includes a floating gate where charge is stored. The floating gate also functions as a transistor gate forming a conductive path between source/drain regions of the substrate. The second gate structure includes a control gate positioned adjacent the floating gate but is separated from the floating gate by an insulator. The application of a first voltage on the control gate results in charge tunneling through the dielectric and being stored in the floating gate. When charge is stored in the floating gate, the transistor is non-conductive and when charge is not stored in the floating gate, the transistor can be made conductive, e.g., by application of a pass voltage signal. Hence, the state of charge stored in the floating gate is indicative of the logical state of the flash memory cell.

Flash memories, which use dielectric trapping layers or floating layers to store charges, are often used in System-On-Chip (SOC) technology, and are formed on the same chip along with other integrated circuits. For example, High-Voltage (HV) circuits, Input/output (10) circuits, core circuits, and Static Random Access Memory (SRAM) circuits are often integrated on the same chip as the flash memories. The respective flash memories are referred to as embedded memories since they are embedded in the chip on which other circuits are formed, as compared to the flash memories formed on chips that do not have other circuits. Flash memories have structures different from HV circuit devices, IO circuit devices, core circuit devices, and SRAM circuit devices. Therefore, the embedding of memory devices with other types of devices faces challenges when the technology evolves.

Figure 1B:
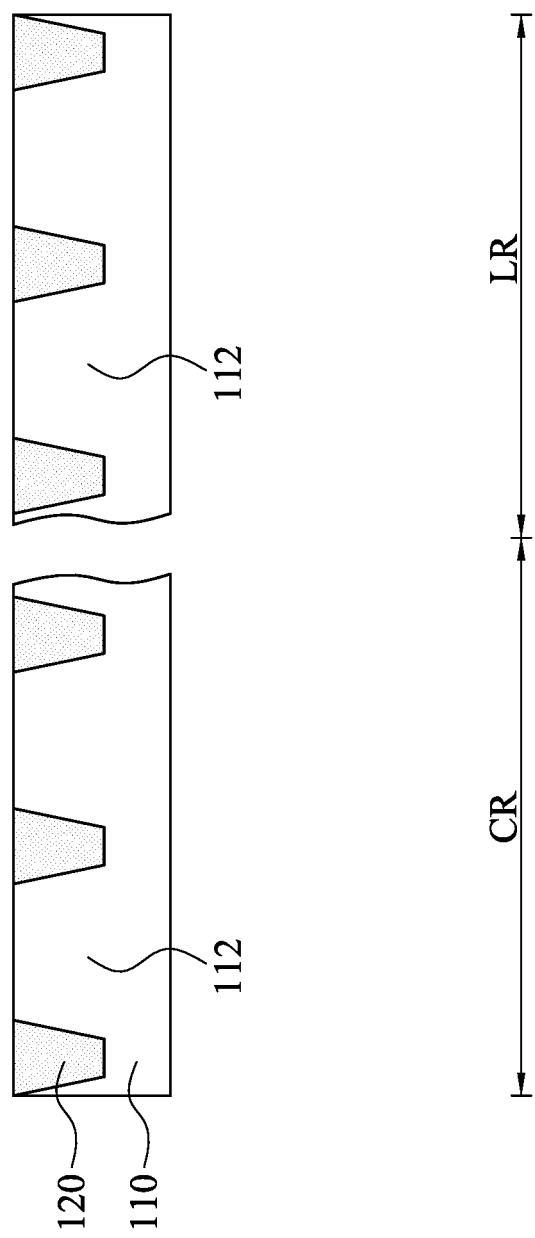

FIGS. 1A through 13B illustrate a method for fabricating an integrated circuit at different stages in accordance with some embodiments of the present disclosure. It is understood that additional steps may be implemented before, during, or after the method, and some of the steps described may be replaced or eliminated for other embodiments of the method. FIG. 1A is a top view of the integrated circuit according with some embodiments, and FIG. 1B is a cross-sectional view taking along line B-B of FIG. 1A. Reference is made to FIGS. 1A and 1B, where a substrate 110 is provided, and isolation structures 120 are formed in the substrate 110. In some embodiments, the substrate 110 can be a semiconductor substrate, such as a bulk silicon substrate, a germanium substrate, a compound semiconductor substrate, or other suitable substrate. The substrate 110 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 110 may be optionally doped with impurity ions such that it is lightly n-type or lightly p-type. The substrate 110 includes a cell region CR where memory devices are to be formed and a peripheral region LR where logic devices are to be formed. For example, HV circuits, Input/output (10) circuits, core circuits, SRAM circuits, and other circuits may be formed in the peripheral region LR. The peripheral region LR is located at an edge of the cell region CR. For example, the peripheral region LR may surround the cell region CR.

Isolation regions 120 are formed in the cell region CR and the peripheral region LR of the substrate 110 to separate and electrically isolate plural active regions 112 of the substrate 110 from each other. As shown in FIG. 1A, the isolation structures 120 extend along a direction D1, and therefore the active regions 112 extend along the direction D1. The isolation regions 120 may include shallow trench isolation (STI) regions as shown. For example, formation of the isolation regions 120 may include etching trenches in the substrate 110, and then filling the trenches with a dielectric material, such as oxide. A planarization process may then be used to remove excess dielectric and to thereby confine this dielectric to the trench boundaries. In present embodiments, the isolation regions 120 may have top surfaces level with the top surface of the substrate 110. In some other embodiments, the isolation regions 120 may protrude above the top surface of the substrate 110.

Figure 2A:
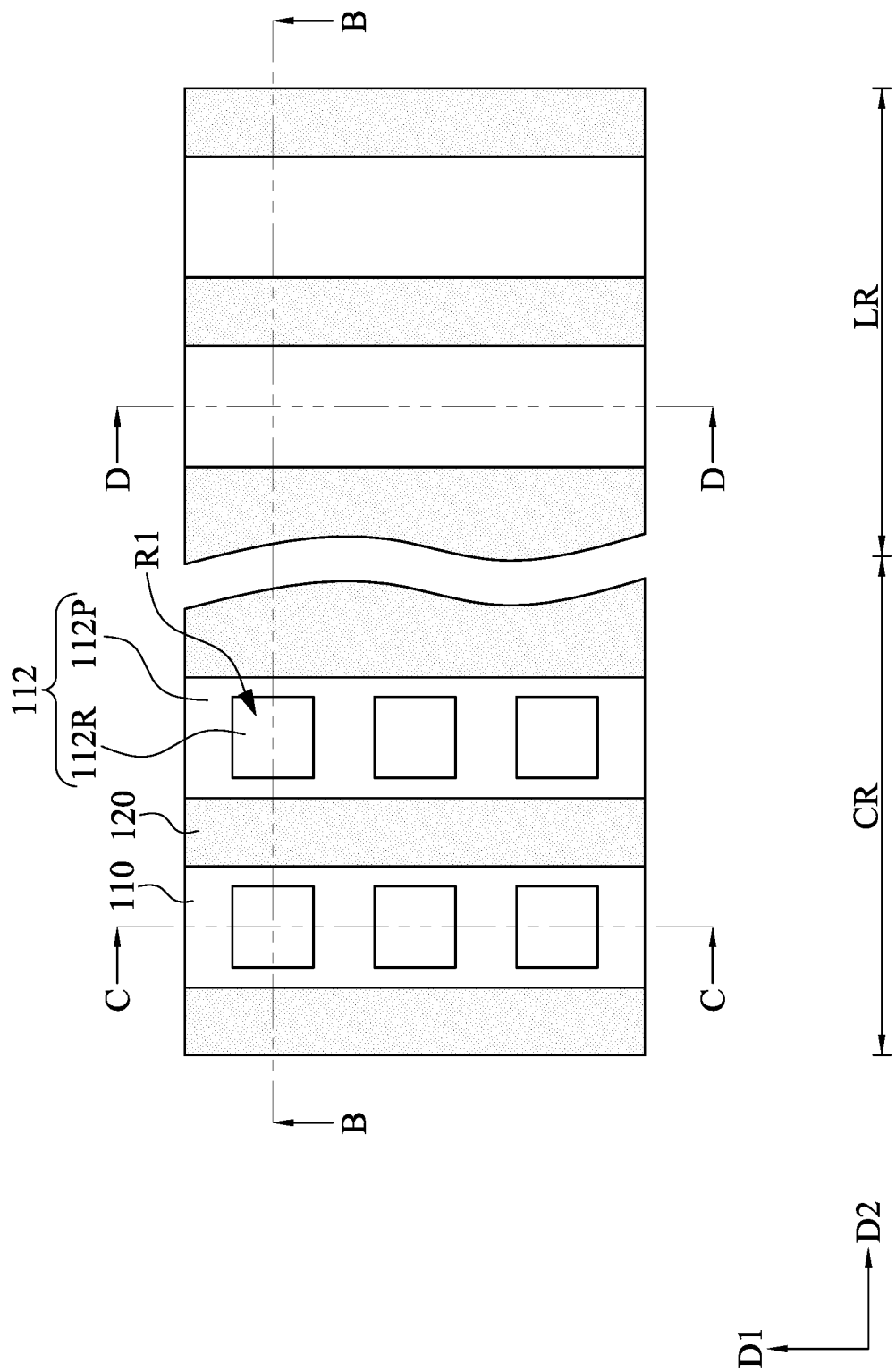
Figure 2B:
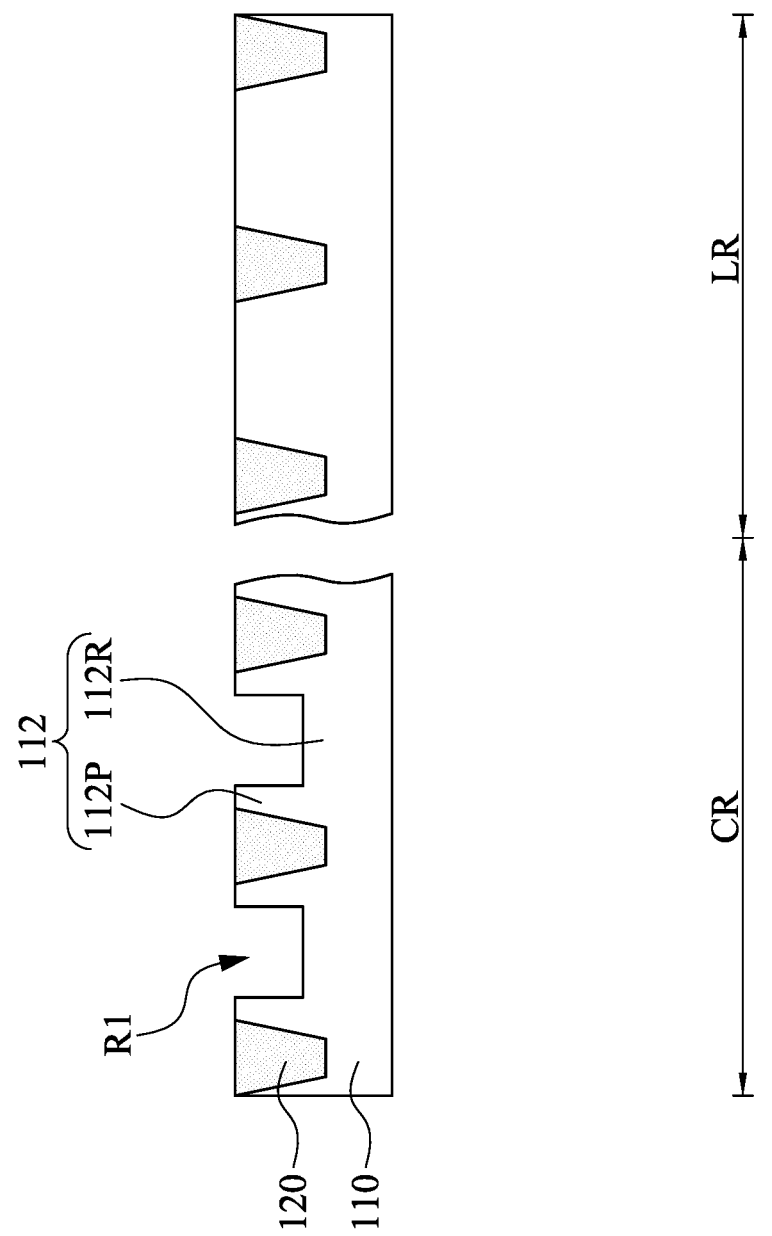

FIG. 2A is a top view of the integrated circuit according with some embodiments, FIG. 2B is a cross-sectional view taking along line B-B of FIG. 2A, FIG. 2C is a cross-sectional view taking along line C-C of FIG. 2A, and FIG. 2D is a cross-sectional view taking along line D-D of FIG. 2A. Reference is made to FIGS. 2A to 2D, where plural recesses R1 are formed in the active regions 112 in the cell region CR of the substrate 110 by suitable etching process. Portions of substrate 110 between the recesses R1 are not etched, and hence have top surfaces higher than the bottom surfaces of recesses R1. For example, the active region 112 includes recessed portions 112R and a protruding portion 112P surrounding the recessed portions 112R, in which the protruding portion 112P has a top surface higher than that of the recessed portions 112R. In some embodiments, each of the active regions 112 may include plural recesses R1, for example, arranged along the direction D1. Each of the recesses R1 is used for accommodating a floating gate structure to be formed later. In the present embodiments, a bottom surface of the recesses R1 is designed to be higher than a bottom surface of the isolation regions 120. For example, the etching process is controlled such that a depth of the recesses R1 is less than a depth of the trenches accommodating the isolation regions 120.

In some embodiments, a mask layer (not shown), such as photoresists, hard masks (e.g., silicon nitride or silicon oxynitride), combinations thereof, or multi-layers thereof, may be formed over the substrate 110 (referring to FIGS. 1A to 1B). The mask layer (not shown) is patterned by a lithography process and an etching process, thereby forming openings in the mask layer, exposing the underlying active regions 112 in the cell region CR of the substrate 110 within the openings. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process may include dry etching, wet etching, and/or other etching methods (e.g., reactive ion etching). Then, another etching process is applied to the exposed active regions 112 using the patterned mask layer as etch mask, for example, by dry etching such as reactive-ion etching (RIE) or by wet etching using a liquid substrate etchant. For example, gas etchants like HBr and $Cl_2$, may be used in the etching the substrate 110, and the patterned mask layer may have a higher etch resistance to the etchant than that of the substrate 110. Through the etching process, recesses R1 are formed in the active regions 112. After the etching processes, the patterned mask layer is then removed, and the removal method may be performed by solvent stripping or plasma ashing, for example.

Figure 3A:
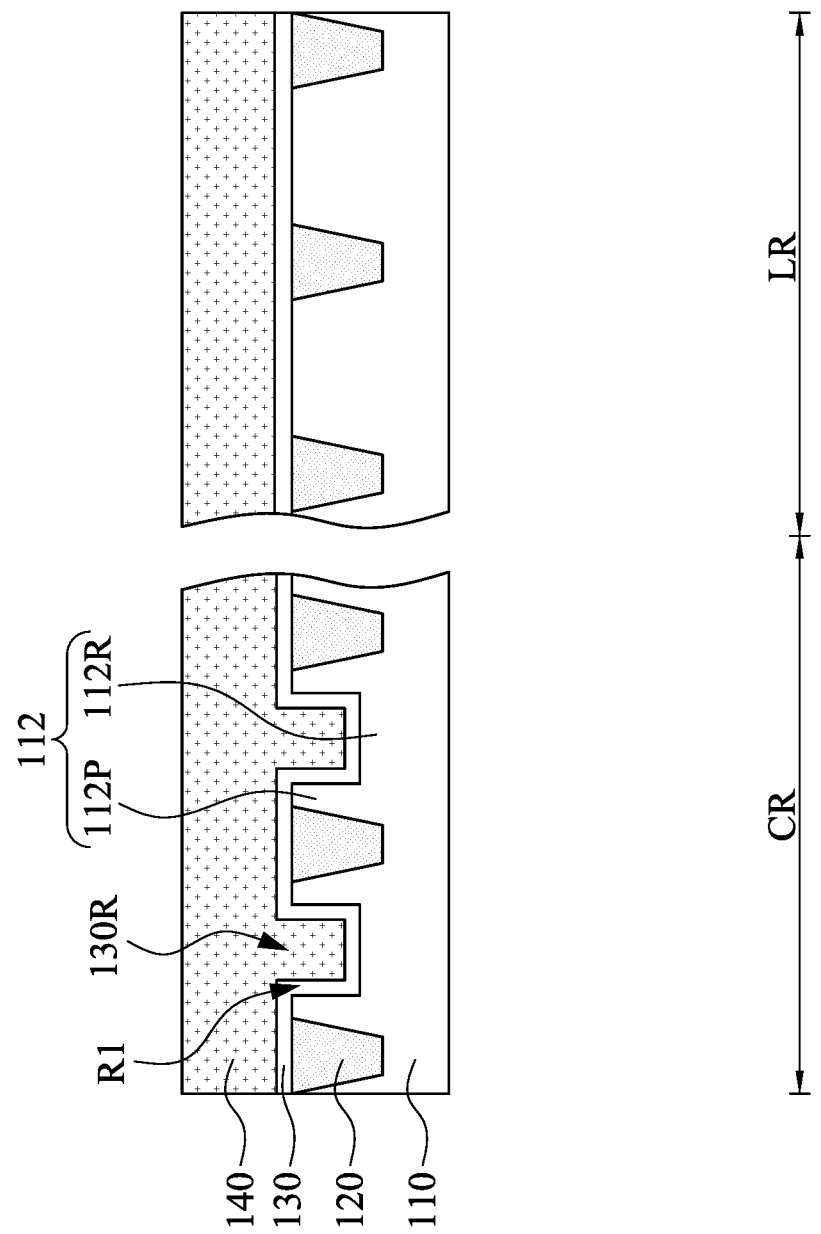

Referring to FIGS. 3A to 3C, where the cross-sectional positions of FIGS. 3A to 3C are the same as the cross-sectional position of FIGS. 2B to 2D. A tunneling film 130 is conformally formed over the substrate 110. As shown in the figure, the tunneling film 130 is deposited over the recessed portion 112R and the protruding portion 112P of the active region 112. In some embodiments, the tunneling film 130 may include, for example, a dielectric material such as silicon dioxide ($SiO_2$), silicon nitride ($Si_3N_4$), oxynitrides (SiON), high-k materials, other non-conductive materials, or combinations thereof. The tunneling film 130 may be formed using thermal oxidation, chemical vapor deposition (CVD), physical vapor deposition (PVD), atomic layer deposition (ALD), ozone oxidation, other suitable processes, or combinations thereof. In some embodiments, the tunneling film 130 may have recesses 130R conforming to the profile of the recesses R1.

A floating gate film 140 is then formed over the tunneling film 130 and overfills recesses 130R of the tunneling film 130 and the recesses R1 of the active region 112. As shown in the figure, the floating gate film 140 is deposited over the recessed portion 112R and the protruding portion 112P of the active region 112. The floating gate film 140 may include polysilicon formed through, for example, low pressure CVD (LPCVD) methods, CVD methods and PVD sputtering methods employing suitable silicon source materials. The floating gate film 140 may include other gate electrode material such as metal, metal alloys, single crystalline silicon, or combinations thereof. The floating gate film 140 may be doped or non-doped. If doped, then this doping may be performed via an in situ introduction of dopant ions into the deposition process or via a subsequent ion implantation.

Figure 4A:
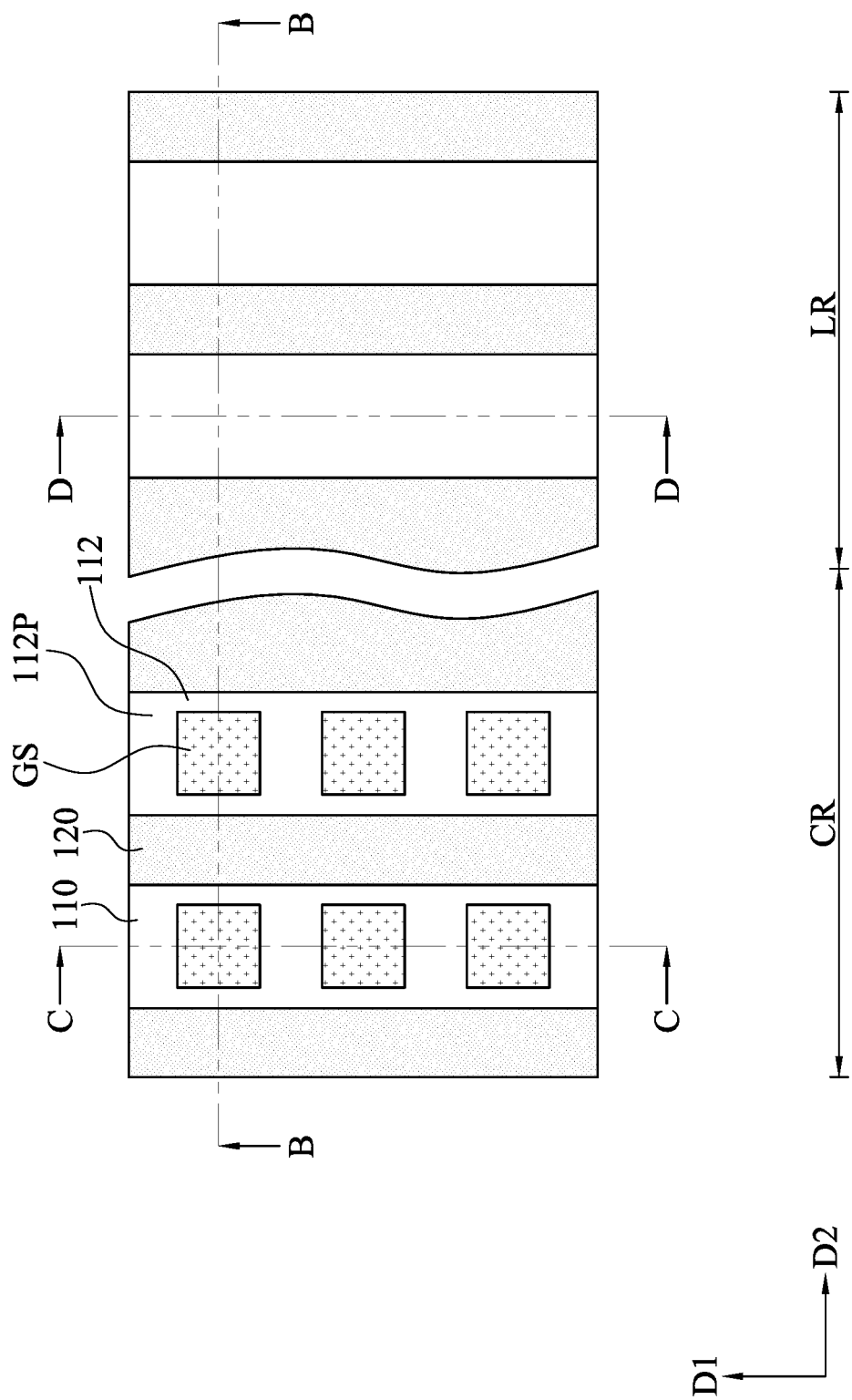
Figure 4B:
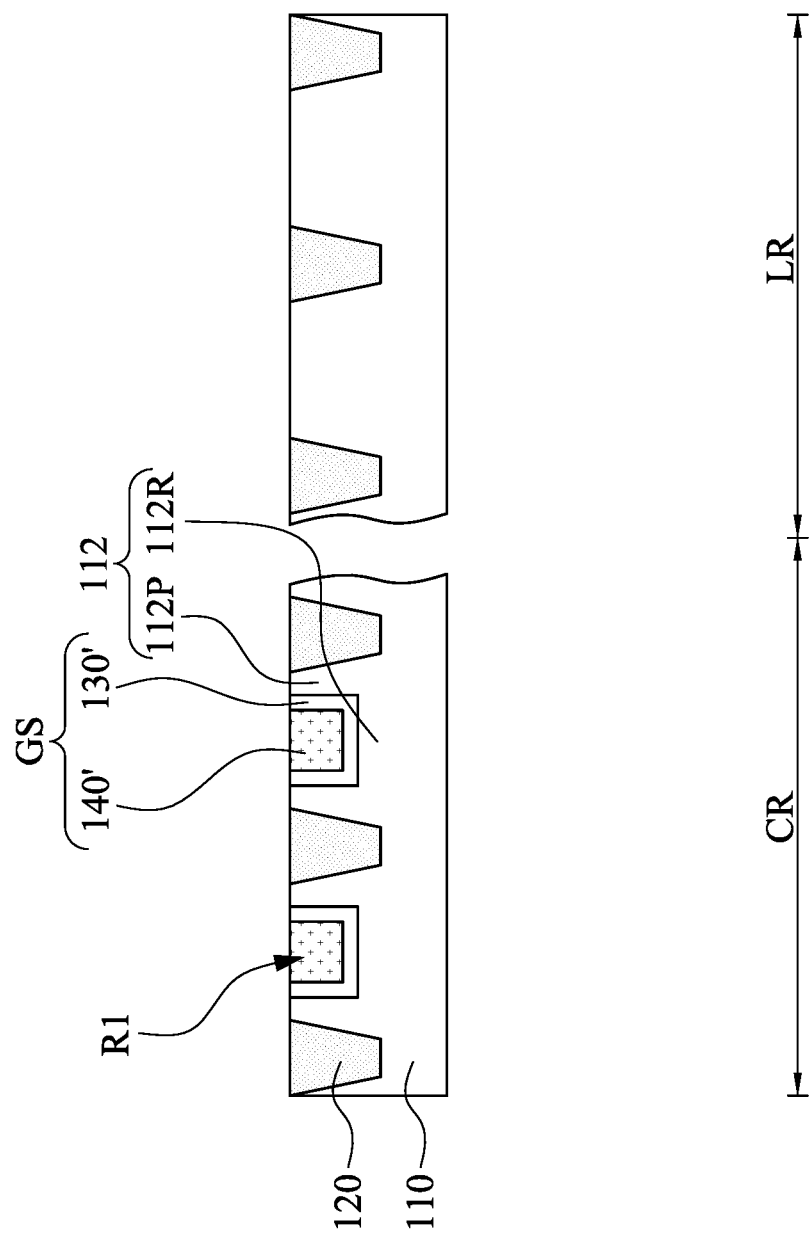

FIG. 4A is a top view of the integrated circuit according with some embodiments, FIG. 4B is a cross-sectional view taking along line B-B of FIG. 4A, and FIG. 4C is a cross-sectional view taking along line C-C of FIG. 4A, and FIG. 4D is a cross-sectional view taking along line D-D of FIG. 4A. A chemical-mechanical polish (CMP) process is performed to the structure of FIGS. 3A to 3C, thereby removing a portion of the tunneling film 130 (referring to FIGS. 3A to 3C) and a portion of the floating gate film 140 (referring to FIGS. 3A to 3C) out of the recesses R1 of the active region 112. For example, the portion of the tunneling film 130 (referring to FIGS. 3A to 3C) and the portion of the floating gate film 140 (referring to FIGS. 3A to 3C) over the protruding portion 112P are removed by the CMP process. The CMP process may be performed until reaching a top surface of the protruding portion 112P of the substrate 110, such that the top surface of the protruding portion 112P of the substrate 110 is exposed. After the CMP process, portions of the tunneling film 130 (referring to FIGS. 3A to 3C) and portions of the floating gate film 140 (referring to FIGS. 3A to 3C) remain in the recesses R1 of the active region 112, and are referred to as tunneling layers 130' and a floating gate electrodes 140', respectively. The tunneling layer 130' may have a first portion between the protruding portion 112P and the floating gate electrode 140' and a second portion between the recessed portion 112R and the floating gate electrode 140'. After the CMP process, in some embodiments, a top surface of the floating gate electrode 140' is substantially level with a top surface of the semiconductor substrate 110. Furthermore, in some embodiments, a top surface of the tunneling layer 130' is substantially level with a top surface of the semiconductor substrate 110.

In the present embodiments, one of the tunneling layers 130' and one of the floating gate electrodes 140' in the same recesses R1 may be referred to as a floating gate structure GS hereinafter. In some embodiments, the floating gate structures GS are formed over the recessed portions 112R of the active region 112, and surrounded by the protruding portion 112P of the active region 112.

Figure 5A:
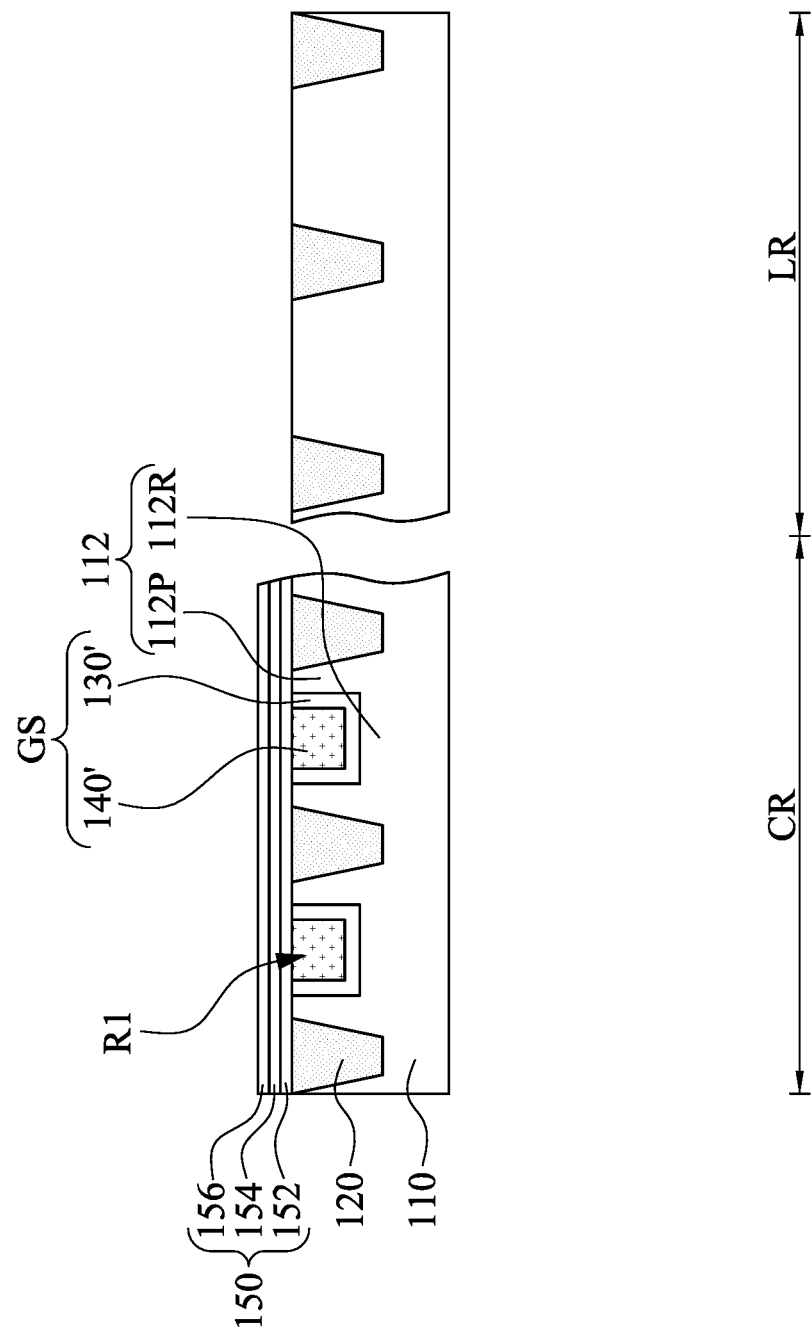

Referring to FIGS. 5A to 5C, where the cross-sectional positions of FIGS. 5A to 5C are the same as the cross-sectional position of FIGS. 4B to 4D. Dielectric stack layers 150 are formed over the floating gate electrodes 140', respectively. The top surfaces of the tunneling layers 130' may be in contact with a bottom surface of the dielectric stack layers 150, respectively. The formation of the dielectric stack layers 150 may include depositing a stack of plural dielectric films over the gate structure GS and the protruding portion 112P of the semiconductor substrate 110, and patterning the stack of the dielectric films into the dielectric stack layers 150 by suitable etching process. For example, patterning the stack of the dielectric films includes removing a portion of the stack of the dielectric films over the protruding portion 112P of the semiconductor substrate 110. The dielectric films may be formed using chemical vapor deposition (CVD), physical vapor deposition (PVD), atomic layer deposition (ALD), ozone oxidation, other suitable processes, or combinations thereof. In some embodiments, each of the dielectric stack layers 150 may be a multi-layer structure. For example, in the present embodiments, each of the dielectric stack layers 150 may be a triple-layer structure, which may include an Oxide-Nitride-Oxide (ONO) structure, with layers 152-156 being a silicon oxide layer, a silicon nitride layer, and a silicon oxide layer, respectively. In some embodiments, the layers of the dielectric stack layers 150 may include, for example, a dielectric material such as silicon dioxide ($SiO_2$), silicon nitride ($Si_3N_4$), oxynitrides (SiON), high-k materials, other non-conductive materials, or combinations thereof. In some other embodiments, each of the dielectric stack layers 150 may be a single-layer structure, such as a silicon oxide layer.

Figure 6A:
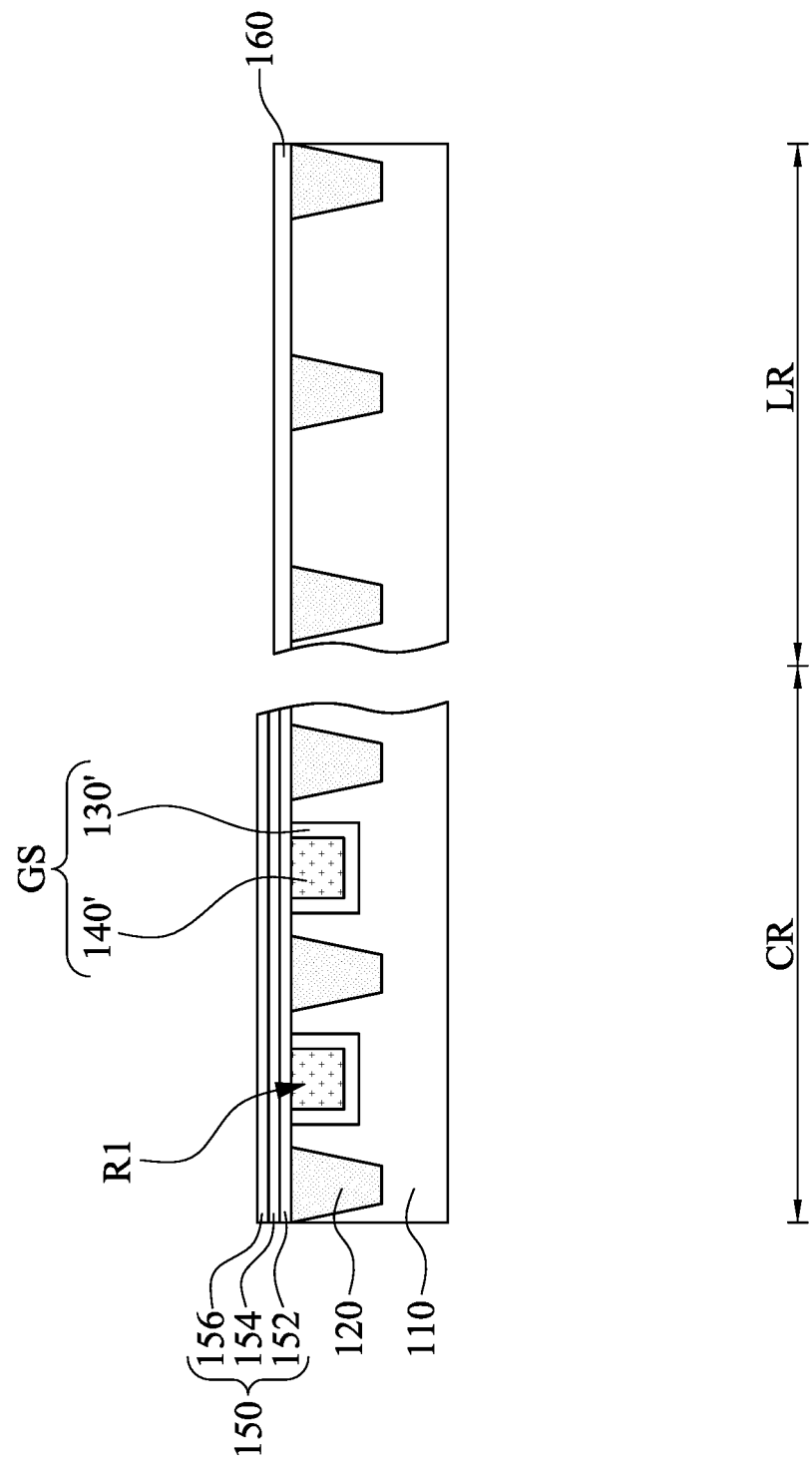

Referring to FIGS. 6A to 6C, where the cross-sectional positions of FIGS. 6A to 6C are the same as the cross-sectional position of FIGS. 5A to 5C. Gate dielectric layers 160 are formed over the active regions 112 in the peripheral region LR. The formation of the gate dielectric layers 160 may include depositing a dielectric film over the structure of FIGS. 5A to 5C, and patterning the dielectric film into the gate dielectric layers 160 by suitable etching process. The dielectric film may be formed using chemical vapor deposition (CVD), physical vapor deposition (PVD), atomic layer deposition (ALD), ozone oxidation, thermal oxidation, other suitable processes, or combinations thereof. In some embodiments, the gate dielectric layers 160 may include, for example, a dielectric material such as silicon dioxide ($SiO_2$), silicon nitride ($Si_3N_4$), oxynitrides (SiON), high-k materials, other non-conductive materials, or combinations thereof.

Figure 7A:
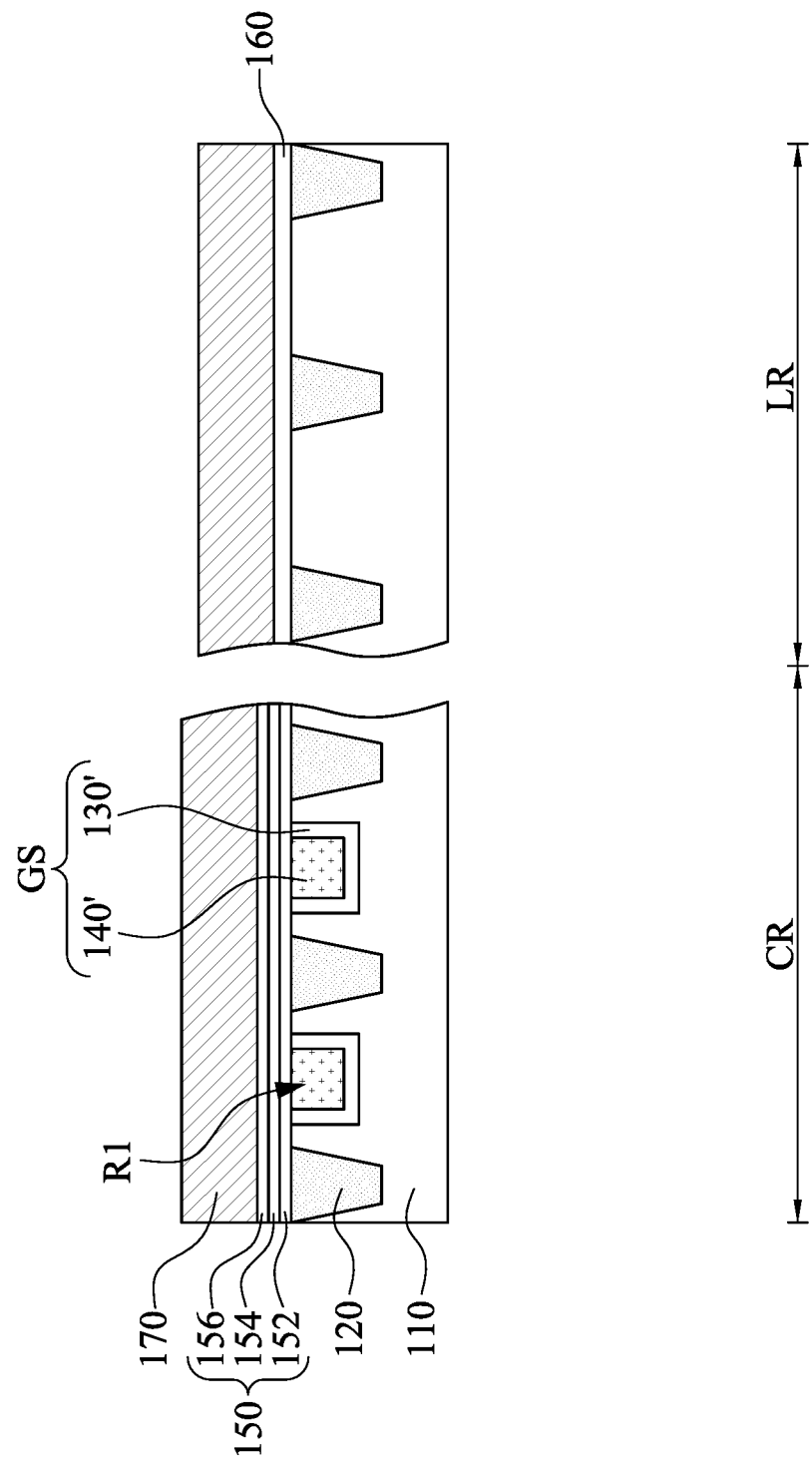
Figure 7C:
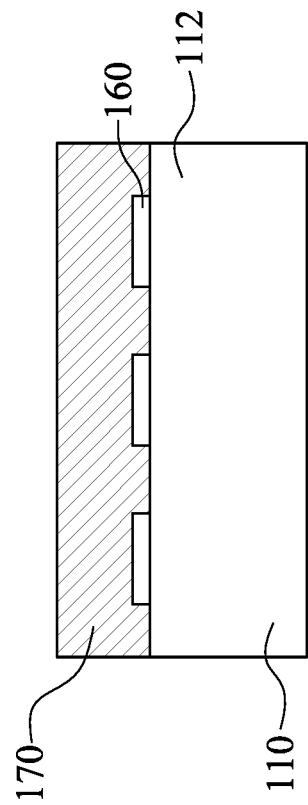
Figure 7B:
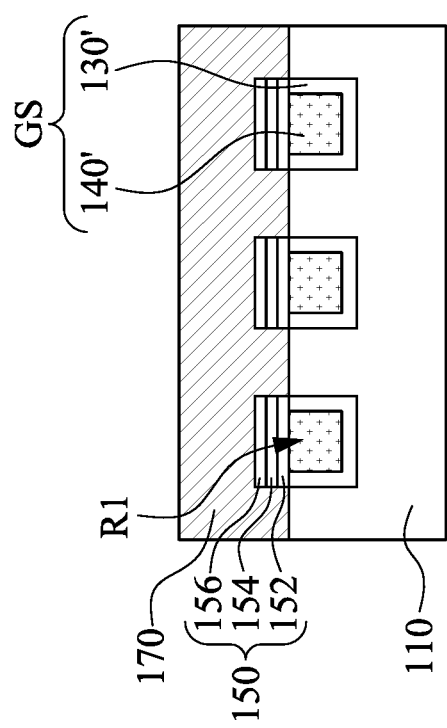

Referring to FIGS. 7A to 7C, where the cross-sectional positions of FIGS. 7A to 7C are the same as the cross-sectional position of FIGS. 6A to 6C. A control gate film 170 is conformally formed over the dielectric stack layers 150, the gate dielectric layers 160, and the substrate 110. The control gate film 170 may include polysilicon formed through, for example low pressure CVD (LPCVD) methods, CVD methods and PVD sputtering methods employing suitable silicon source materials. If desired, the control gate film 170 may be ion implanted to the desired conductive type. It is to be appreciated other gate electrode material such as metal, metal alloys, single crystalline silicon, or combinations thereof. In the present embodiments, since the dielectric stack layers 150 having the ONO structure are thicker than the dielectric layers 160, the control gate film 170 in the cell region CR has a top surface higher than a top surface of the control gate film 170 in the peripheral region LR.

Figure 8A:
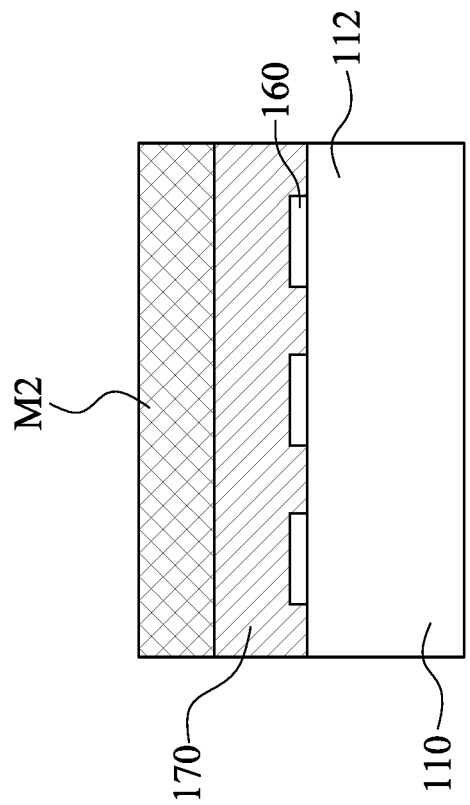
Figure 8B:
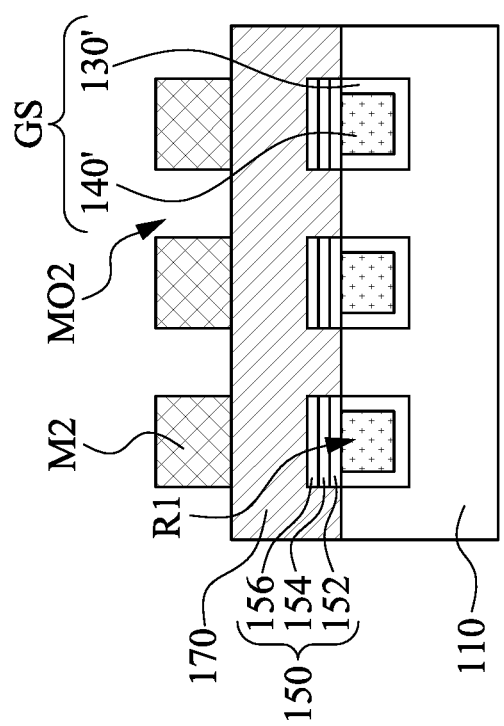

Referring to FIGS. 8A to 8B, where the cross-sectional positions of FIGS. 8A to 8B are the same as the cross-sectional position of FIGS. 7B to 7C. A mask layer M2, such as photoresists, hard masks (e.g., silicon nitride or silicon oxynitride), combinations thereof, or multi-layers thereof, may be formed over the control gate film 170. Then, the mask layer M2 is patterned by a lithography process and an etching process, thereby forming openings MO2 in the mask layer M2, exposing the underlying control gate film 170 within the openings MO2. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process may include dry etching, wet etching, and/or other etching methods (e.g., reactive ion etching).

Figure 9A:
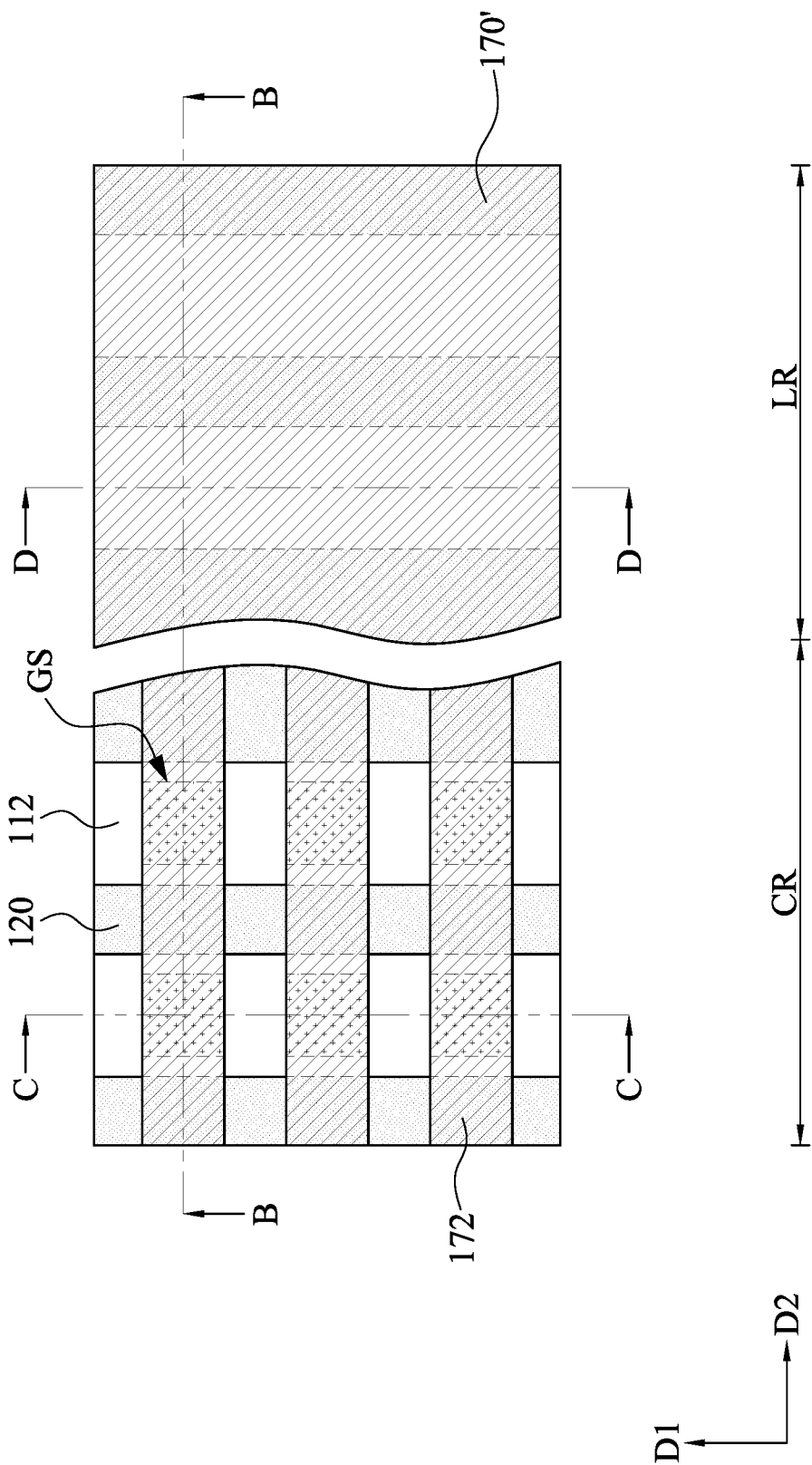
Figure 9B:
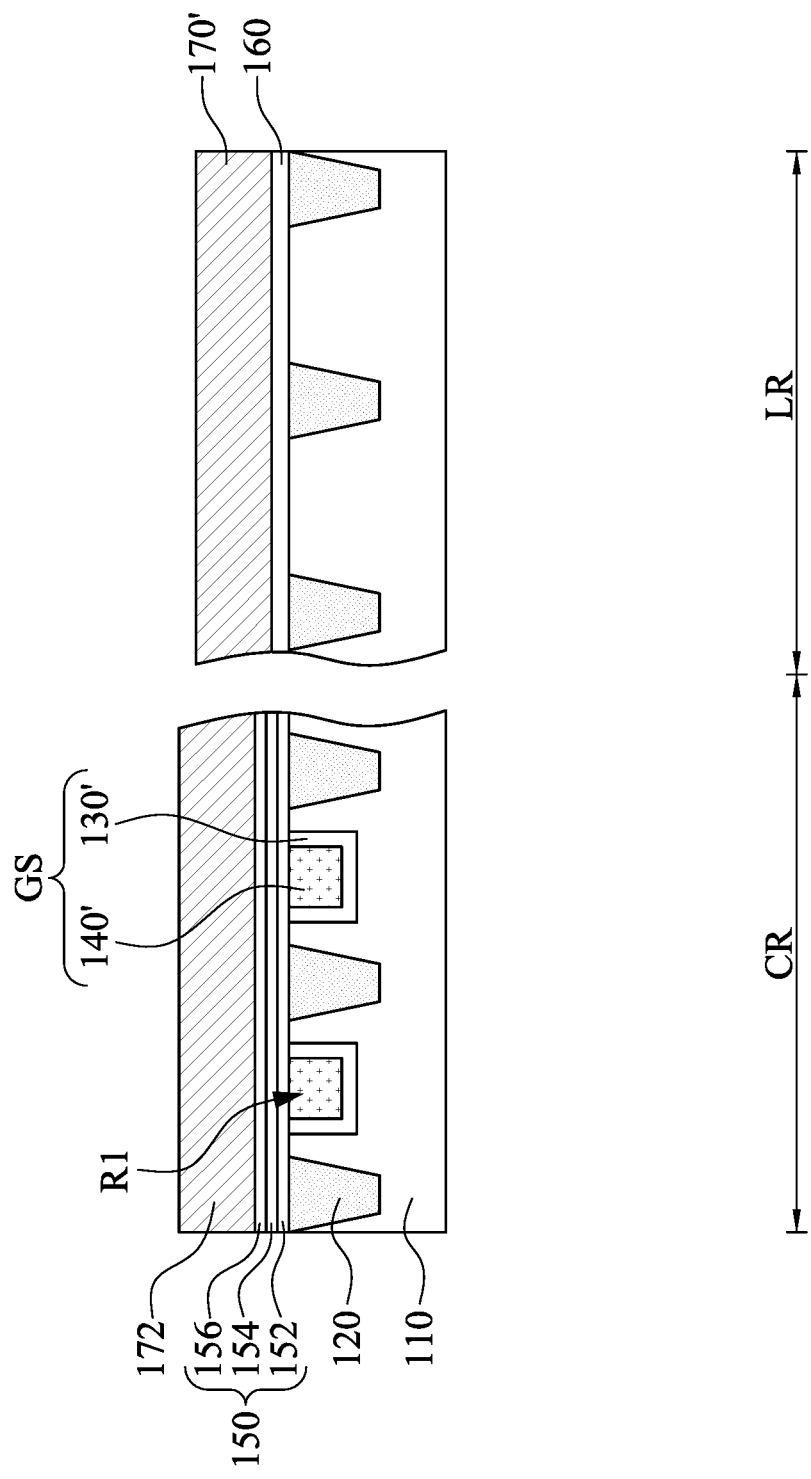
Figure 9C:
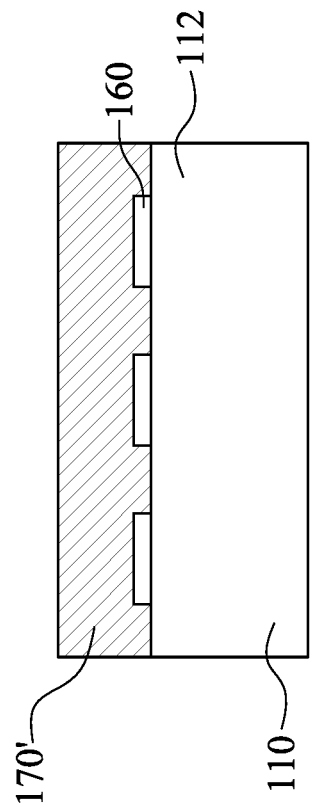
Figure 9D:
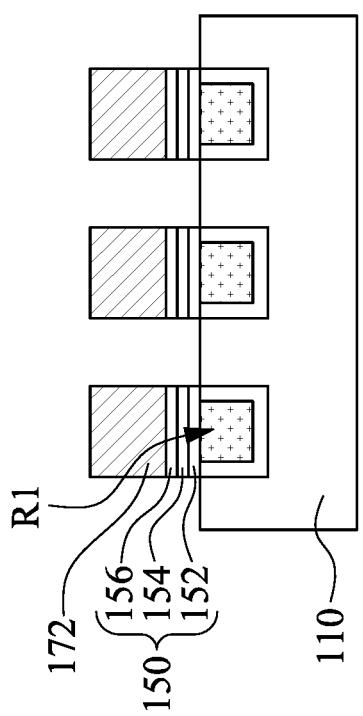

FIG. 9A is a top view of the integrated circuit according with some embodiments, FIG. 9B is a cross-sectional view taking along line B-B of FIG. 9A, and FIG. 9C is a cross-sectional view taking along line C-C of FIG. 9A, and FIG. 9D is a cross-sectional view taking along line D-D of FIG. 9A. A portion of the control gate film 170 in the cell region CR is patterned into plural control gate electrodes 172 by one or more suitable etching processes. For example, one or more etching processes are applied to the control gate film 170 (referring to FIGS. 8A to 8B) through the openings MO2 of the mask layer M2 (referring to FIGS. 8A to 8B). Portions of the control gate film 170 (referring to FIGS. 8A to 8B) covered by the patterned mask layer M2 (referring to FIGS. 8A to 8B) are protected from the one or more etching processes, and may be respectively referred to as control gate electrodes 172 in the cell region CR and a control gate film 170' in the peripheral region LR after the one or more etching processes. The control gate electrodes 172 are respectively over the dielectric stack layers 150. For example, the control gate electrodes 172 and the underlying dielectric stack layers 150 may both extend along the direction D2. After the etching processes, the patterned mask layer M2 (referring to FIGS. 8A to 8B) is then removed, and the removal method may be performed by solvent stripping or plasma ashing, for example.

Figure 10A:
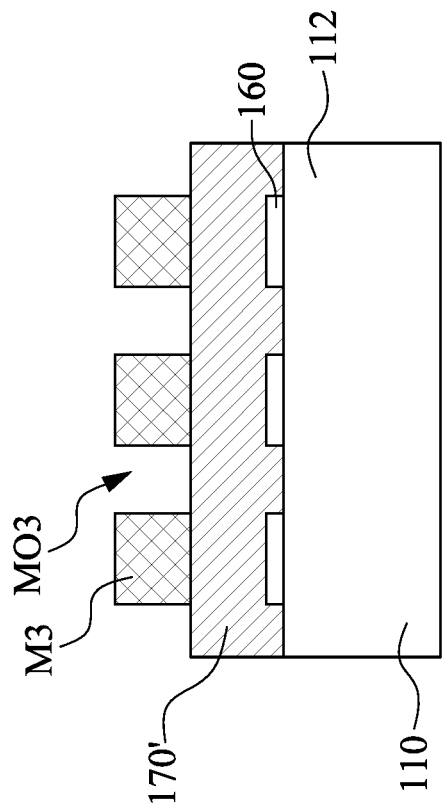
Figure 10B:
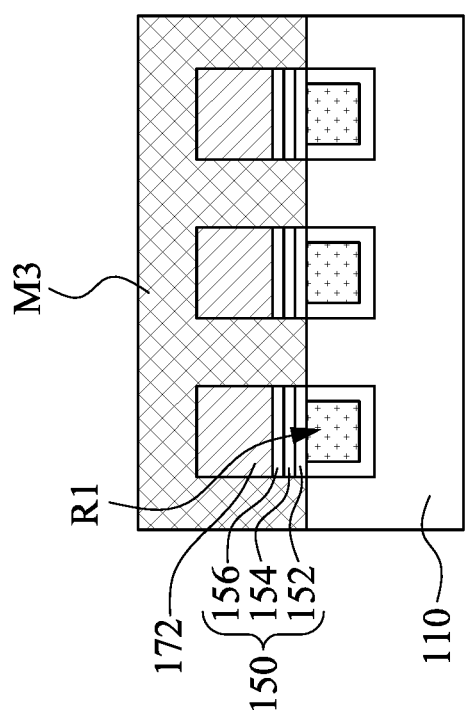

Referring to FIGS. 10A to 10B, where the cross-sectional position of FIGS. 10A to 10B are the same as the cross-sectional position of FIGS. 9C to 9D. A mask layer M3, such as photoresists, hard masks (e.g., silicon nitride or silicon oxynitride), combinations thereof, or multi-layers thereof, may be formed over the structure of FIGS. 9A to 9B. Then, the mask layer M3 is patterned by a lithography process and an etching process, thereby forming openings MO3 in the mask layer M3, exposing the underlying control gate film 170' within the openings MO3. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process may include dry etching, wet etching, and/or other etching methods (e.g., reactive ion etching).

Figure 11A:
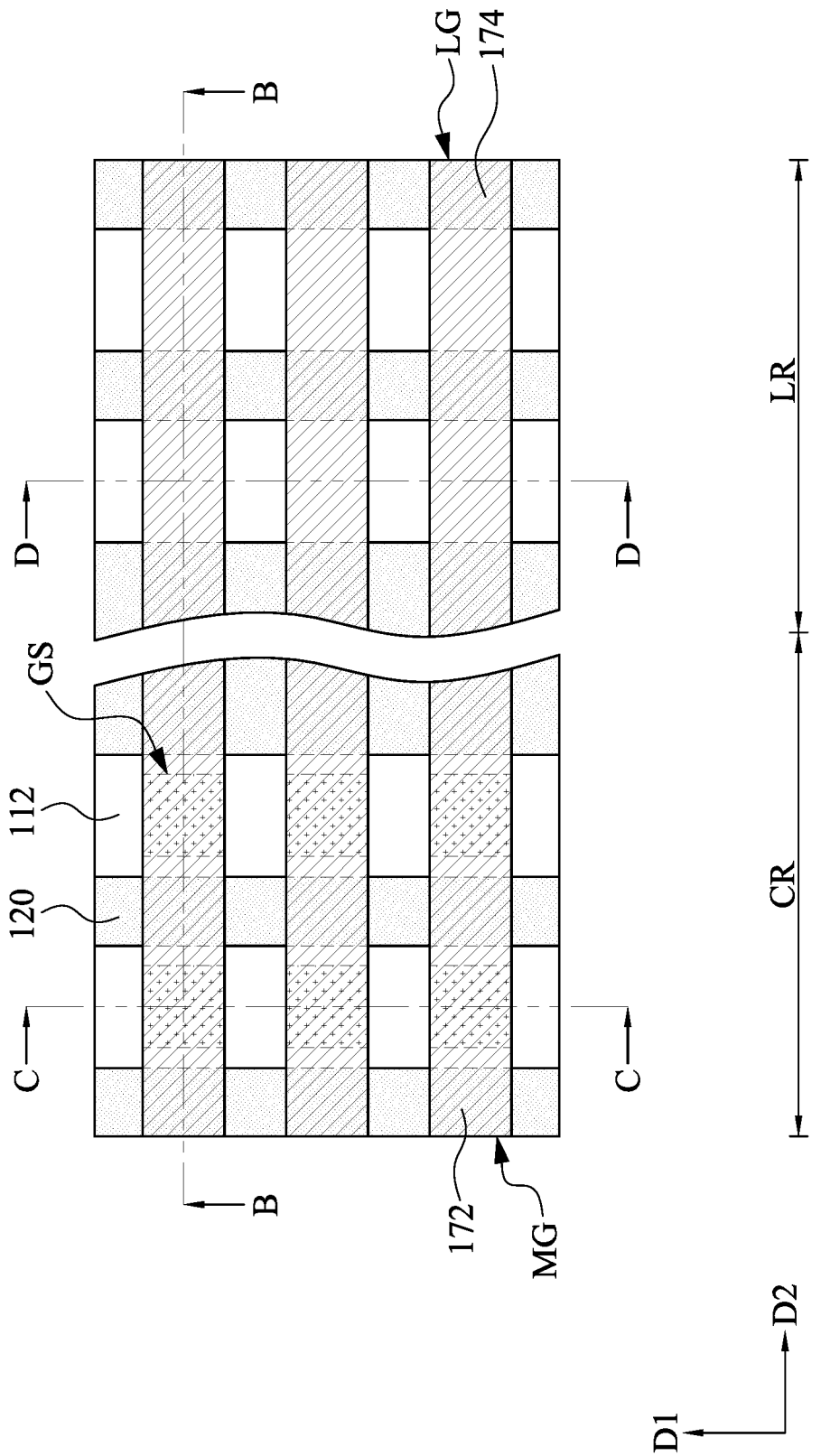
Figure 11B:
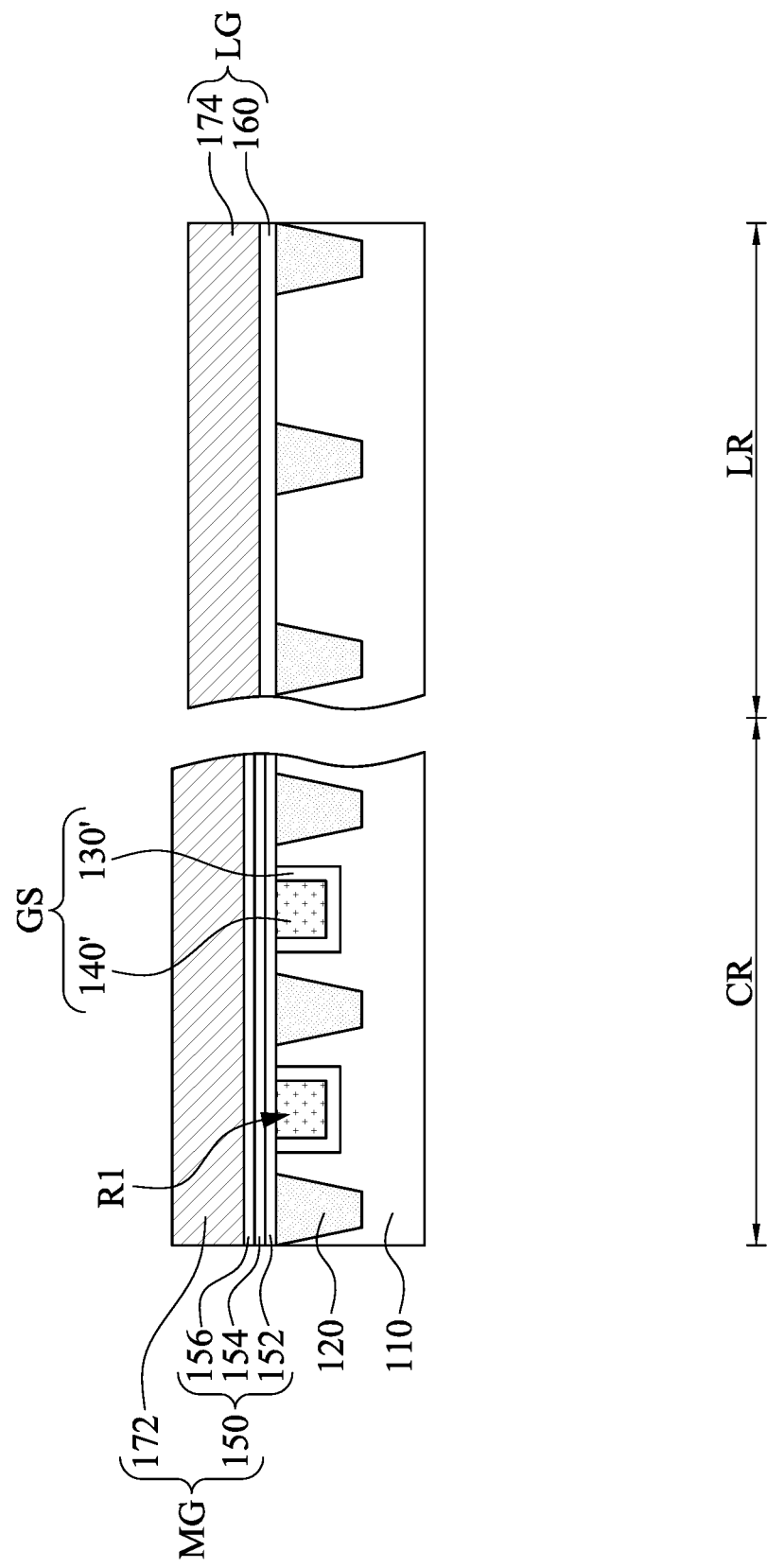
Figure 11D:
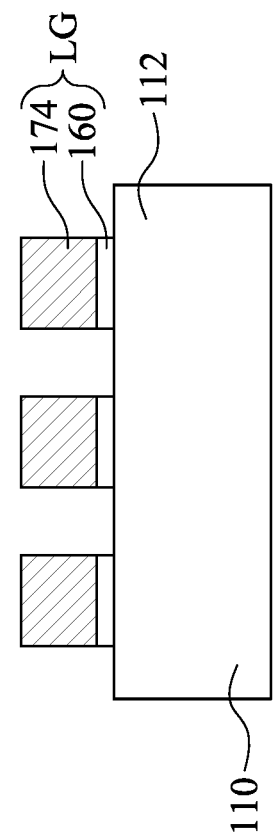
Figure 11C:
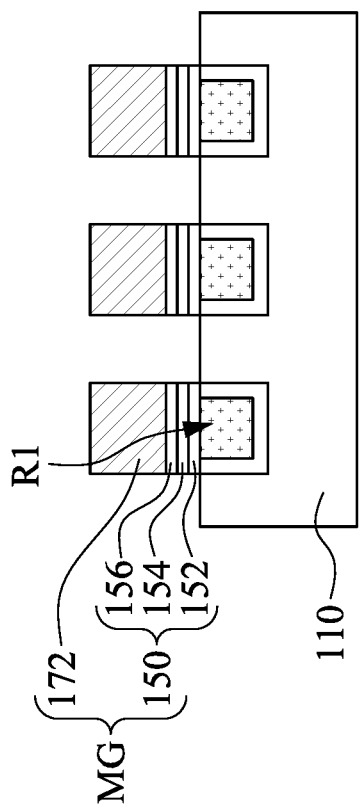

FIG. 11A is a top view of the integrated circuit according with some embodiments, FIG. 11B is a cross-sectional view taking along line B-B of FIG. 11A, FIG. 11C is a cross-sectional view taking along line C-C of FIG. 11A, and FIG. 11D is a cross-sectional view taking along line D-D of FIG. 11A. The control gate film 170' is patterned into plural gate electrodes 174 by one or more suitable etching processes. For example, one or more etching processes are applied to the control gate film 170' (referring to FIG. 10B) through the openings MO3 of the mask layer M3 (referring to FIG. 10B). Portions of the control gate film 170' (referring to FIG. 10B) covered by the patterned mask layer M3 (referring to FIG. 10B) are protected from the one or more etching processes, and may be respectively referred to as gate electrodes 174 in the peripheral region LR after the one or more etching processes. The gate electrodes 174 are respectively over the dielectric layers 160. For example, the gate electrodes 174 and the underlying dielectric layers 160 may both extend along the direction D2. After the etching processes, the patterned mask layer M3 (referring to FIGS. 10A to 10B) is then removed, and the removal method may be performed by solvent stripping or plasma ashing, for example.

For clear illustration, a combination of one of the control gate electrodes 172 and one of the dielectric stack layers 150 below the one of the control gate electrodes 172 is referred to as a memory gate stack MG, and a combination of one of the gate electrodes 174 and one of the gate dielectric layers 160 is referred to as a logic gate stack LG hereinafter. As aforementioned, the memory gate stack MG and the logic gate stack LG extend along the direction D2.

Figure 12A:
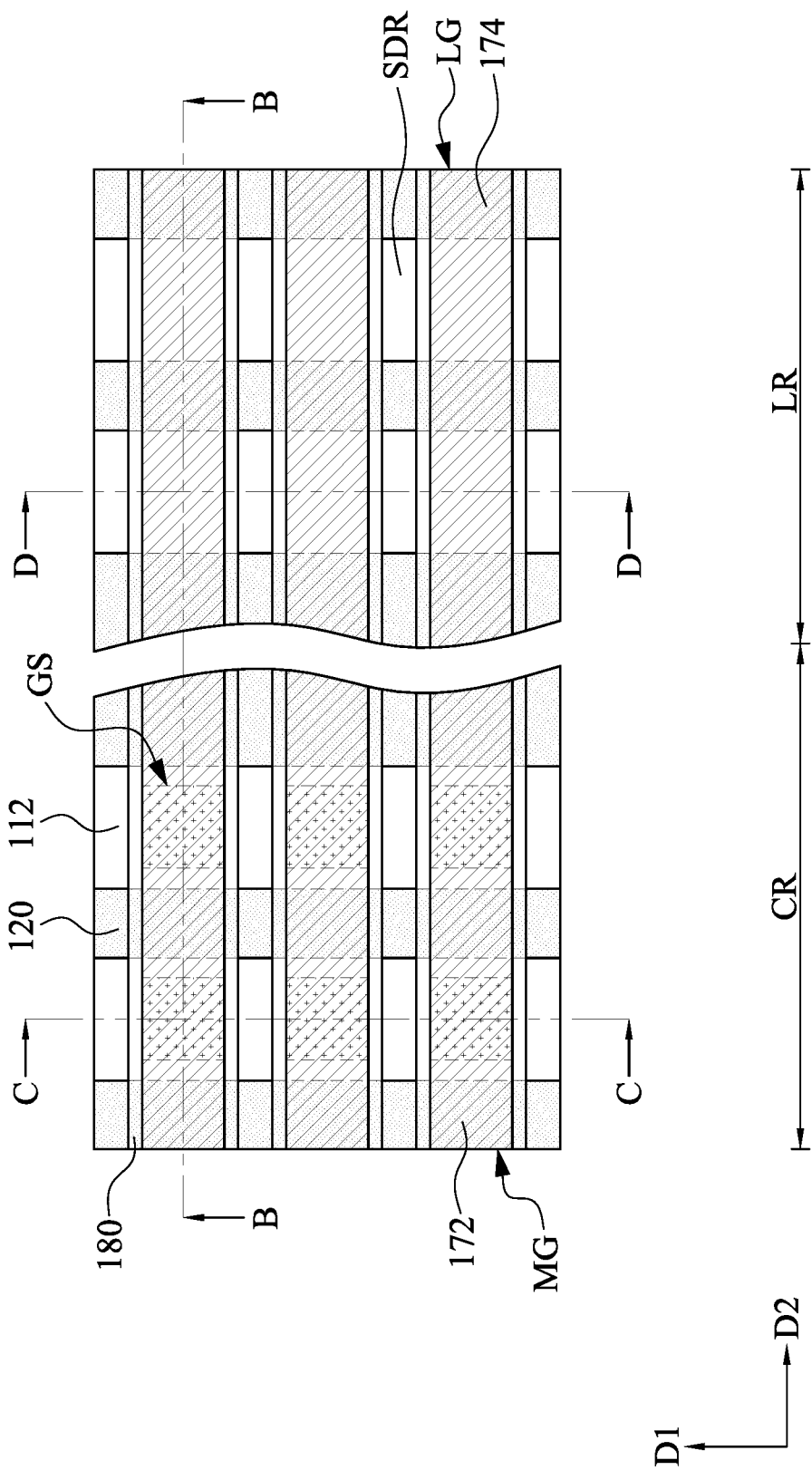
Figure 12B:
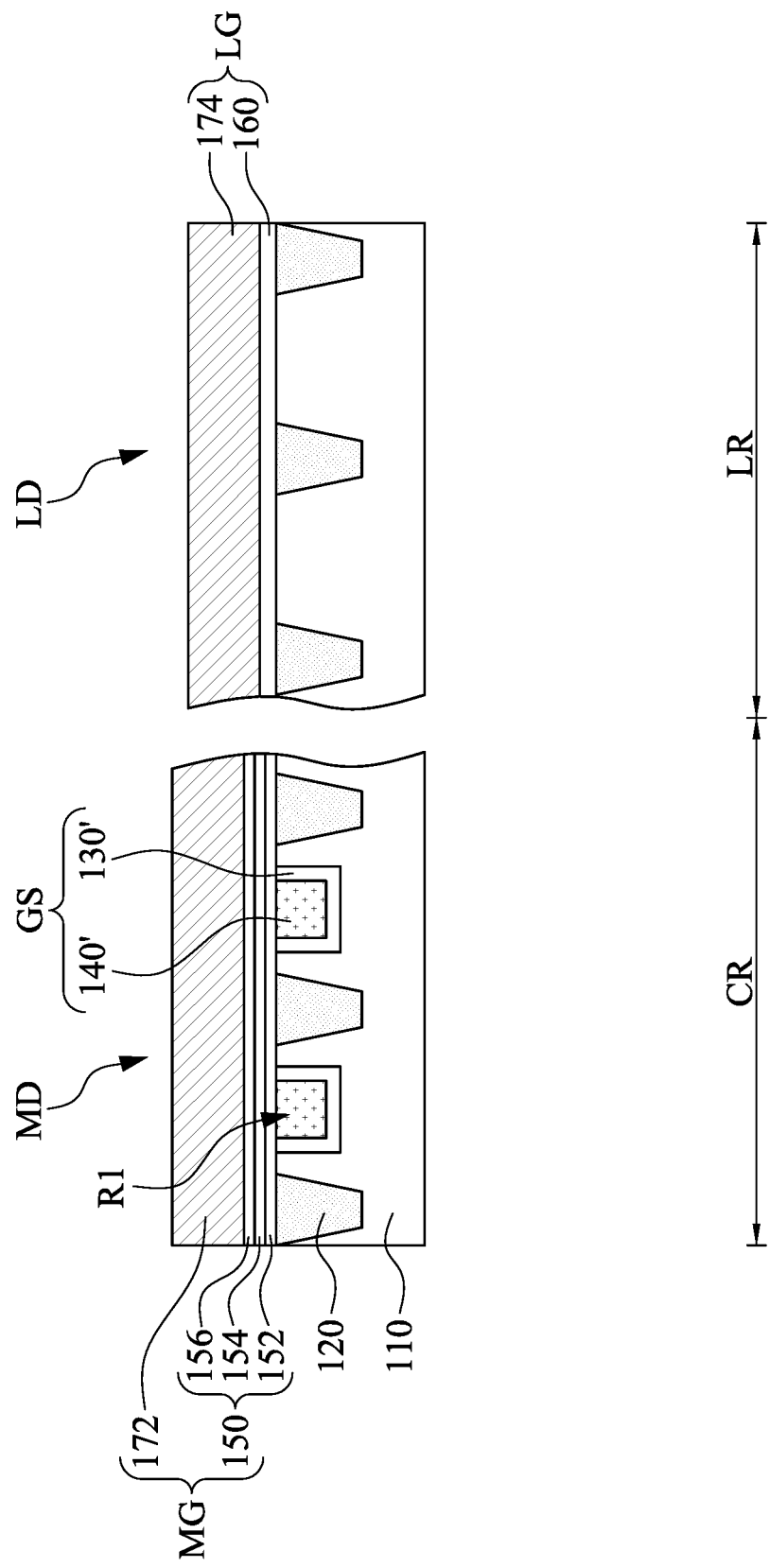
Figures 12C, 12D:
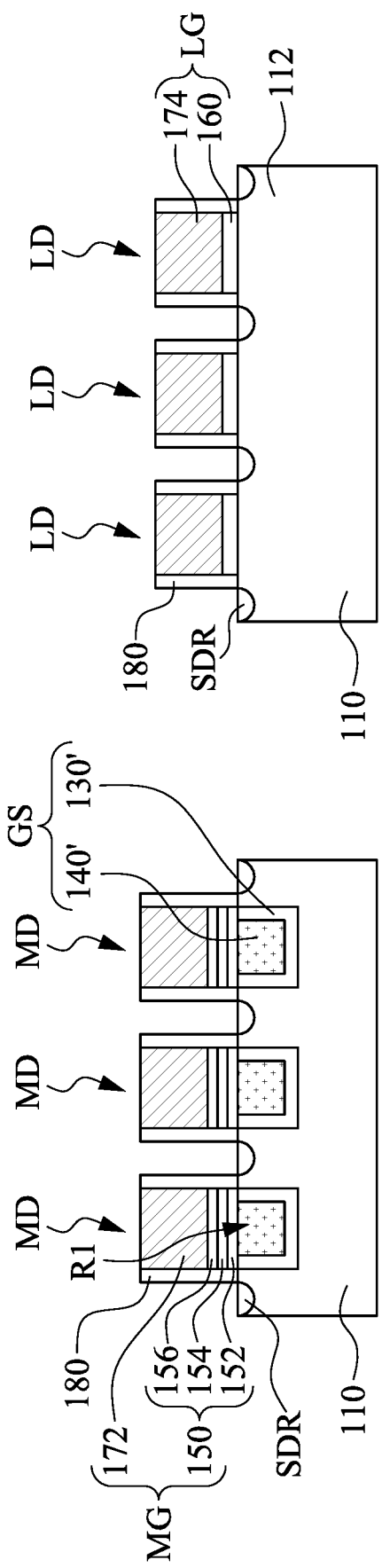

FIG. 12A is a top view of the integrated circuit according with some embodiments, FIG. 12B is a cross-sectional view taking along line B-B of FIG. 12A, FIG. 12C is a cross-sectional view taking along line C-C of FIG. 12A, and FIG. 12D is a cross-sectional view taking along line D-D of FIG. 12A. Gate spacers 180 are formed on opposite sidewalls of the memory gate stacks MG and the logic gate stacks LG. In some embodiments, the gate spacers 180 may include suitable dielectric materials, such as silicon oxide, silicon nitride, silicon oxynitride, the like, or the combination thereof. The gate spacers 180 may include one or plural dielectric layers. For example, the gate spacers 180 may include an inner silicon oxide layer, a middle silicon nitride layer, and an outer silicon oxide layer. In some embodiments, a dielectric film may be conformally formed over the structure of FIGS. 11A to 11D, and an etching process (e.g., dry etch process) is performed to remove the horizontal portions of the dielectric film and remain vertical portions of the dielectric film, thereby forming the gate spacers 180 on opposite sidewalls of the memory gate stacks MG and the logic gate stacks LG.

After the formation of the gate spacers 180, source/drain regions SDR are formed in the substrate 110. For example, one or more ion implantation processes are performed to the protruding portion 112P of the substrate 110, thereby forming the source/drain regions SDR in the protruding portion 112P of the substrate 110. The source/drain regions SDR may be formed be the same or different ion implantation processes. In some other embodiments, the source/drain regions SDR may be formed through epitaxy, and the protruding portion 112P of the substrate 110 may be recessed for accommodating the epitaxial source/drain regions SDR.

Through the configuration, plural memory devices MD and plural logic devices LD are formed in the cell region CR and the peripheral region LR, respectively. The memory devices MD may be arranged as an array including a plurality of rows and columns of the flash memory devices MD. In some embodiments, each of the memory devices MD includes the floating gate structure GS, the memory gate stack MG over the floating gate structure GS, and the source/drain regions SDR adjacent to the floating gate structure GS. In some embodiments, each of the logic devices LD includes the logic gate stack LG and the source/drain regions SDR adjacent to the logic gate stack LG.

Figures 13A, 13B:
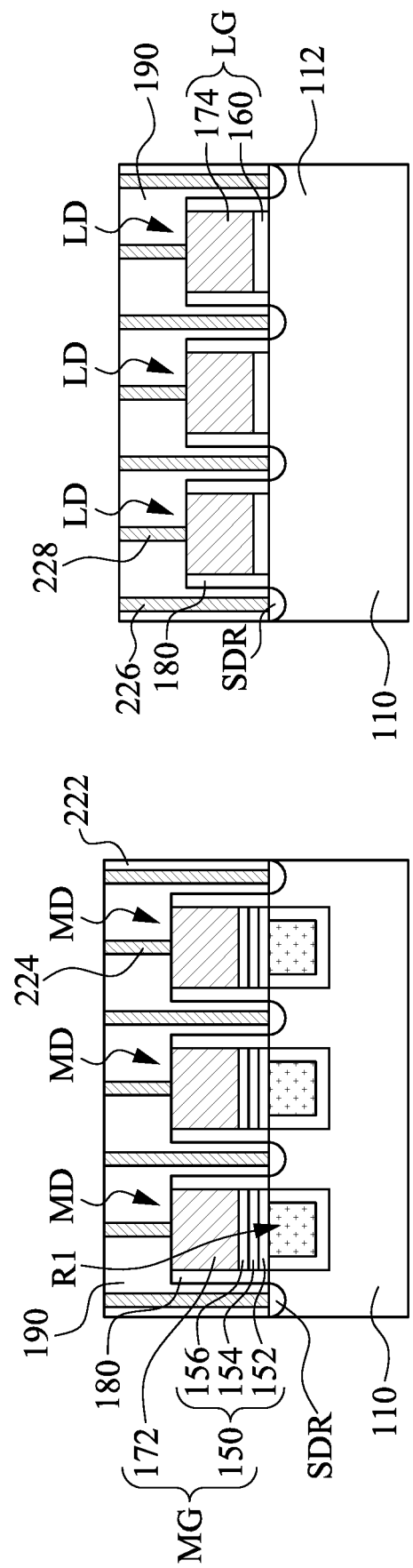

Referring to FIGS. 13A to 13B, where the cross-sectional positions of FIGS. 13A to 13B are the same as the cross-sectional position of FIGS. 12C to 12D. An interlayer dielectric (ILD) layer 190 is formed over the structure of FIGS. 12A to 12D, and then a metallization pattern is formed in the ILD layer 190. The ILD layer 190 is formed of a dielectric material such as Phospho-Silicate Glass (PSG), Boro-Silicate Glass (BSG), Boron-Doped Phospho-Silicate Glass (BPSG), or the like. The ILD layer 190 has a top surface higher than the top surface of the memory gate stacks MG and the logic gate stacks LS. A CMP may optionally be performed to level the top surface of ILD layer 190 in the cell region CR with the top surface of the of ILD layer 190 in the peripheral region LR. The metallization pattern includes plural contacts 222, 224, 226, 228, vias (not shown), and metal layers (not shown) may be formed in and over the ILD layer 190. For example, the ILD layer 190 is etched to form plural openings therein, the openings is filled with suitable conductive metals, and then a portion of the conductive metals outside the openings of the ILD layer 190 is removed by a CMP process, thereby forming the contacts 222, 224, 226, and 228 in the ILD layer 190. The contacts 222 may be connected to the source/drain regions SDR of the memory devices MD, and the contact 224 may be connected to the control gate electrodes 172 of the memory devices MD. The contacts 226 may be connected to the source/drain regions SDR of the logic devices LD, and the contact 228 may be connected to the gate electrodes 174 of the logic devices LD.

In some cases that floating gates are formed over a top surface of the substrate, since the floating gate electrodes have great thicknesses, the memory gate stacks of the memory devices will have a top surface much higher than a top surface of the gate stacks of other transistors in a peripheral region. This incurs process difficulty. For example, due to flowability, the photoresists in the peripheral region may be thicker than photoresists in the cell region, which may limit the process window. For example, if the photoresists in the peripheral region is too thick, the photolithography process may result in a large critical dimension of the transistors in peripheral regions. In another example, if the photoresists in the cell region is too thin, the photoresists in the cell region may not well protect the memory gate stacks from being etched. For relaxing process window, addition mask layers may be used for protecting the memory gate stacks from being etched, which may undesirably increase fabrication cost. Alternatively, a guard ring may be disposed between the memory and peripheral regions for relaxing process window, but the guard ring may undesirably enlarge chip size. The thickness difference of photoresists between the cell region and the peripheral region may also result in defocus issues during the photolithography process. Furthermore, contacts on the memory gate stack and the gate stacks of other transistors may have landing issues due to the gate height difference.

In the present embodiments, by embedding the floating gate electrodes 140' in the substrate 110, the top surface of the memory gate stacks MG is lowered, thereby reducing the height difference between the top surface of the memory gate stacks MG and the top surface of the gate stacks LG of other transistors (e.g., logic devices LD). Through the configuration, the process window is relaxed without using additional mask layer or a guard ring, thereby saving fabrication cost and chip size. Furthermore, thickness difference of photoresists between the cell region CR and the peripheral region LR is reduced, thereby addressing the defocus issues during the photolithography process. In addition, the height difference between the top surface of the memory gate stacks MG and the top surface of the gate stacks LD of the logic devices LD is reduced, thereby addressing the contact landing issues during the formation of the contacts 224, and 228.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by embedding the floating gate electrodes in the substrates, the top surface of the memory gate stacks is lowered, thereby reducing the height difference between the top surface of the memory gate stacks and the top surface of the gate stacks of other transistor, which is beneficial for relaxing the process window. Another advantage is that the process window is relaxed without using additional mask layer or a guard ring, thereby saving fabrication cost and chip size. Still advantage is that the photoresists may be formed with a more uniform thickness, thereby addressing the defocus issues during the photolithography process. Still advantage is that the height difference between the top surface of the memory gate stacks and the top surface of the gate stacks of the logic devices is reduced, thereby addressing the contact landing issues.

According to some embodiments of the present disclosure, a method for manufacturing an integrated circuit is provided. The method includes etching a recess in a semiconductor substrate; forming a gate structure in the recess in the semiconductor substrate, in which the gate structure includes a tunneling layer and a floating gate electrode over the tunneling layer; forming a dielectric layer over the gate structure; and forming a control gate electrode over the dielectric layer.

According to some embodiments of the present disclosure, a method for manufacturing an integrated circuit is provided. The method includes patterning a semiconductor substrate to have a recessed portion and a protruding portion surrounding the recessed portion; forming a gate structure over the recessed portion of the semiconductor substrate, wherein the gate structure includes a tunneling layer and a floating gate electrode over the tunneling layer; forming a dielectric layer over the gate structure; and forming a control gate electrode over the dielectric layer.

According to some embodiments of the present disclosure, an integrated circuit includes a semiconductor substrate and a memory device over a first region of the semiconductor substrate. The memory device includes a gate structure, a dielectric layer, and a control gate electrode. The gate structure is in the first region of the semiconductor substrate, and the gate structure includes a tunneling layer and a floating gate electrode surrounded by the tunneling layer. The dielectric layer is over the floating gate electrode. The control gate electrode is over the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit, the method comprising:
    etching a recess in a memory cell region of a semiconductor substrate;
    forming a floating gate structure in the recess in the semiconductor substrate, wherein the floating gate structure comprises a tunneling layer and a floating gate electrode over the tunneling layer;
    forming a memory dielectric layer over the floating gate structure;
    forming a logic gate dielectric layer over a logic region of the semiconductor substrate, wherein the memory dielectric layer is thicker than the logic gate dielectric layer;
    depositing a gate electrode layer over the memory dielectric layer and the logic gate dielectric layer, wherein the gate electrode layer has a first portion over the memory dielectric layer and a second portion over the logic gate dielectric layer, and a top surface of the first portion of the gate electrode layer is higher than a top surface of the second portion of the gate electrode layer;
    patterning the first portion of the gate electrode layer to form a control gate electrode over the memory dielectric layer; and
    patterning the second portion of the gate electrode layer to form a logic gate electrode over the logic gate dielectric layer.

2. The method of claim 1, wherein forming the floating gate structure comprises:
    forming a tunneling film over the recess of the semiconductor substrate;
    forming a floating gate electrode film over the tunneling film and the recess of the semiconductor substrate; and
    removing a portion of the tunneling film and a portion of the floating gate electrode film out of the recess of the semiconductor substrate.

3. The method of claim 2, wherein removing the portion of the tunneling film and the portion of the floating gate electrode film comprises:
    performing a planarization process until reaching the semiconductor substrate.

4. The method of claim 1, wherein forming the floating gate structure is performed such that a top surface of the semiconductor substrate is exposed.

5. The method of claim 1, wherein forming the logic gate dielectric layer is performed after forming the memory dielectric layer.

6. The method of claim 1, further comprising:
    forming a plurality of isolation structures in the semiconductor substrate prior to etching the recess in the semiconductor substrate.

7. A method for manufacturing an integrated circuit, the method comprising:
    patterning a semiconductor substrate to have a recessed portion and a protruding portion surrounding the recessed portion;
    forming a floating gate structure over the recessed portion of the semiconductor substrate, wherein the floating gate structure comprises a tunneling layer and a floating gate electrode over the tunneling layer;
    depositing a dielectric film over the floating gate structure and the protruding portion of the semiconductor substrate;
    patterning the dielectric film by an etching process to form a dielectric layer over the floating gate structure;
    after patterning the dielectric film, depositing a gate electrode layer over the dielectric layer; and
    patterning the gate electrode layer to form a control gate electrode over the dielectric layer.

8. The method of claim 7, further comprising:
    forming a source/drain region in the protruding portion of the semiconductor substrate after patterning the gate electrode layer.

9. The method of claim 7, wherein forming the floating gate structure comprises:
    forming a tunneling film over the recessed portion and the protruding portion of the semiconductor substrate;

forming a floating gate electrode film over the recessed portion and the protruding portion of the semiconductor substrate; and removing a portion of the tunneling film and a portion of the floating gate electrode film over the protruding portion of the semiconductor substrate.

10. The method of claim 7, wherein forming the floating gate structure is performed such that the tunneling layer has a first portion between the protruding portion and the floating gate electrode and a second portion between the recessed portion and the floating gate electrode.

11. The method of claim 7, further comprising:
forming a plurality of isolation structures in the semiconductor substrate prior to patterning the semiconductor substrate.

12. A method for manufacturing an integrated circuit, the method comprising:
patterning a semiconductor substrate such that the semiconductor substrate has a first area and a second area having a top surface higher than a top surface of the first area;
forming a floating gate structure over the first area of a semiconductor substrate, wherein the floating gate structure comprises a tunneling layer and a floating gate electrode over the tunneling layer;
forming an oxide-nitride oxide (ONO) dielectric layer over the floating gate structure;
forming a logic gate dielectric layer over the second area of the semiconductor substrate;
forming a control gate electrode over the ONO dielectric layer, wherein a bottom surface of the control gate electrode is higher than the top surface of the second area of the semiconductor substrate; and
forming a logic gate electrode over the logic gate dielectric layer.

13. The method of claim 12, further comprising:
planarizing a top surface of the floating gate structure with the top surface of the second area of the semiconductor substrate prior to forming the logic gate dielectric layer and prior to forming the ONO dielectric layer.

14. The method of claim 12, wherein forming the logic gate electrode is performed such that a top surface of the floating gate electrode is at a position lower than a bottom surface of the logic gate electrode.

15. The method of claim 12, wherein
forming the ONO dielectric layer over the floating gate structure is performed such that the tunneling layer is in contact with the ONO dielectric layer.

16. The method of claim 12, wherein forming the floating gate structure is performed such that the tunneling layer has a first portion below the floating gate electrode and a second portion extending along a sidewall of the floating gate electrode.

17. The method of claim 16, wherein forming the floating gate structure is performed such that the second portion of the tunneling layer extends from an end of the first portion of the tunneling layer upward to a position level with a top surface of the floating gate electrode.

18. The method of claim 1, wherein forming the memory dielectric layer comprises:
depositing an ONO dielectric film over the floating gate structure and the logic region of the semiconductor substrate; and
etching a portion of the ONO dielectric film over the logic region of the semiconductor substrate.

19. The method of claim 1, wherein patterning the first portion of the gate electrode layer is performed using a first etch mask, and patterning the second portion of the gate electrode layer is performed using a second etch mask different from the first etch mask.

20. The method of claim 7, further comprising:
forming a spacer on a sidewall of the control gate electrode, wherein the spacer is free of contacting the floating gate electrode.

* * * * *